US010825768B2

(12) United States Patent
Lee et al.

(10) Patent No.: US 10,825,768 B2
(45) Date of Patent: Nov. 3, 2020

(54) SEMICONDUCTOR DEVICE INCLUDING RESISTOR STRUCTURE

(71) Applicant: SAMSUNG ELECTRONICS CO., LTD., Suwon-si, Gyeonggi-Do (KR)

(72) Inventors: Tae-Hee Lee, Seoul (KR); Hee-Sung Kam, Anyang-si (KR); Kyoung-Hoon Kim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/277,597

(22) Filed: Feb. 15, 2019

(65) Prior Publication Data

US 2020/0051912 A1 Feb. 13, 2020

(30) Foreign Application Priority Data

Aug. 8, 2018 (KR) .......................... 10-2018-0092292

(51) Int. Cl.
| H01L 29/00 | (2006.01) |
| H01L 21/20 | (2006.01) |
| H01L 23/522 | (2006.01) |
| H01L 21/768 | (2006.01) |
| H01L 49/02 | (2006.01) |

(52) U.S. Cl.
CPC .... *H01L 23/5228* (2013.01); *H01L 21/76897* (2013.01); *H01L 28/24* (2013.01)

(58) Field of Classification Search
CPC ...................................................... H01L 35/30
USPC .................. 438/281, 330, 382; 257/533–537
See application file for complete search history.

(56) References Cited

U.S. PATENT DOCUMENTS

| 7,206,329 | B2 * | 4/2007 | Nakatsuka | ............. | B82Y 20/00 |
| | | | | | 372/38.02 |
| 8,363,365 | B2 * | 1/2013 | Fukuoka | ................. | H01L 23/60 |
| | | | | | 361/54 |
| 8,649,202 | B2 * | 2/2014 | Sakaguchi | ......... | G11C 13/0004 |
| | | | | | 365/148 |
| 8,748,988 | B2 * | 6/2014 | Kitajima | ................. | H01L 28/20 |
| | | | | | 257/359 |
| 8,754,395 | B1 | 6/2014 | Hong et al. | | |
| 8,951,859 | B2 | 2/2015 | Higashitani et al. | | |
| 8,969,999 | B2 * | 3/2015 | Liang | ................ | H01L 27/11206 |
| | | | | | 257/529 |
| 9,520,458 | B2 * | 12/2016 | Kang | .................. | H01L 27/0629 |

(Continued)

FOREIGN PATENT DOCUMENTS

| JP | 2013-187506 | 9/2013 |
| KR | 10-2017-0124019 | 11/2017 |

*Primary Examiner* — Calvin Lee
(74) *Attorney, Agent, or Firm* — F. Chau & Associates, LLC

(57) ABSTRACT

A semiconductor device includes a substrate including a resistor region, a plurality of lower patterns in the resistor region, and a resistor line pattern on the plurality of lower patterns and the substrate of the resistor region. The plurality of lower patterns extend in a first direction parallel to a surface of the substrate and are spaced apart from each other in a second direction perpendicular to the first direction and parallel to the surface of the substrate. The resistor line pattern extends in the second direction. The resistor line pattern on the lower patterns has an upper surface and a lower surface protruding in a third direction perpendicular to the surface of the substrate.

20 Claims, 24 Drawing Sheets

(56) References Cited

U.S. PATENT DOCUMENTS

| | | |
|---|---|---|
| 9,589,981 B2 | 3/2017 | Nishikawa et al. |
| 9,691,782 B1 | 6/2017 | Hwang et al. |
| 9,721,621 B2 | 8/2017 | Sugita et al. |
| 9,786,680 B2 | 10/2017 | Shimizu et al. |
| 9,876,031 B1 | 1/2018 | Shimizu et al. |
| 2018/0005732 A1 | 1/2018 | Shimoichi et al. |

* cited by examiner

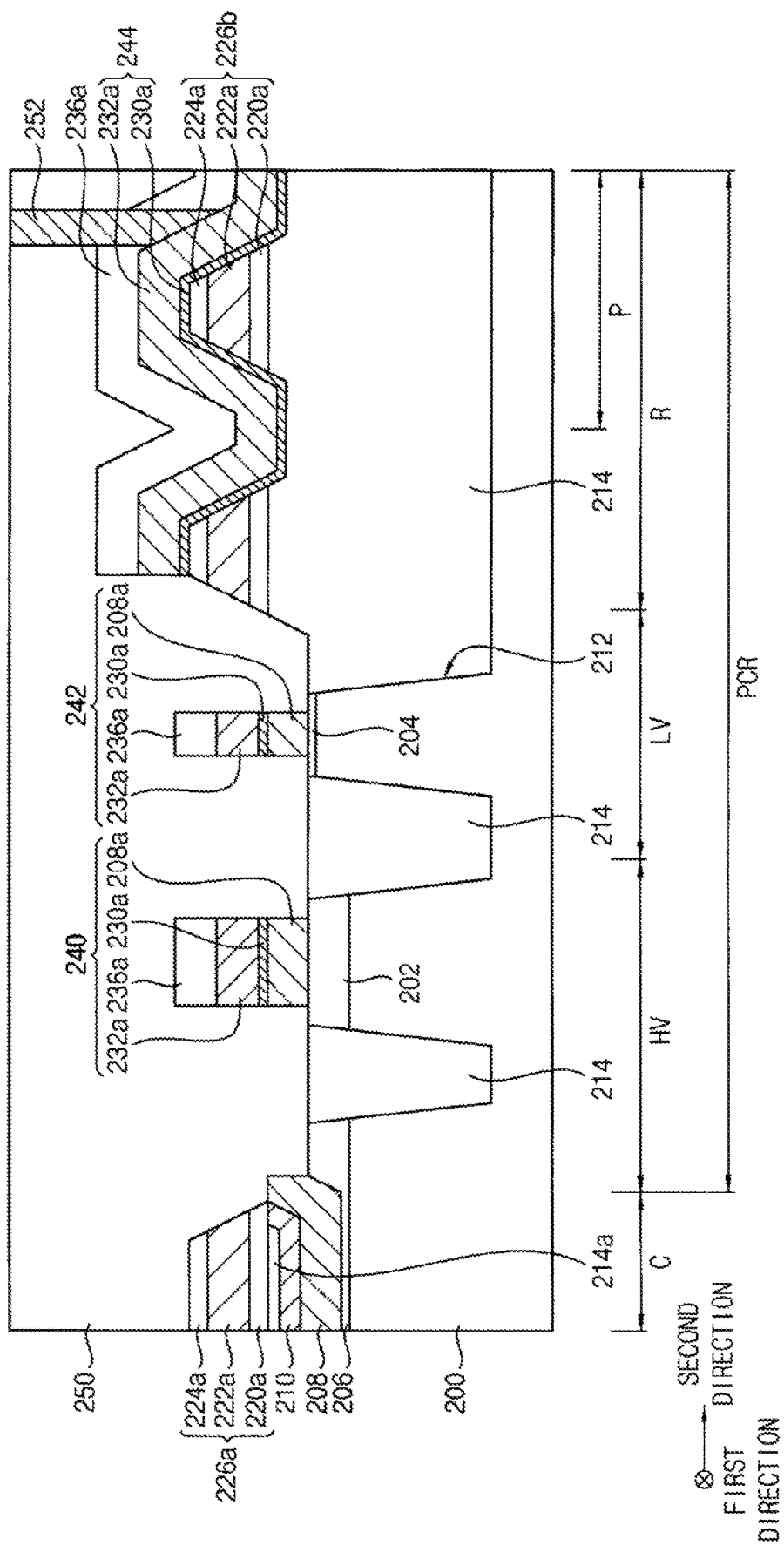

SEMICONDUCTOR DEVICE INCLUDING RESISTOR STRUCTURE

CROSS-REFERENCE TO RELATED APPLICATION

This application claims priority under 35 U.S.C. § 119 to Korean Patent Application No. 10-2018-0092292 filed on Aug. 8, 2018 in the Korean Intellectual Property Office, the disclosure of which is hereby incorporated by reference in its entirety.

TECHNICAL FIELD

Example embodiments of the present disclosure relate to a semiconductor device, and more specifically, to a semiconductor device including a resistor structure.

DISCUSSION OF RELATED ART

A semiconductor device includes a main cell region and a peripheral region for driving main cells. In the peripheral region, various devices such as transistors, resistor structures, capacitors, and/or inductors are disposed to form peripheral circuits. However, to obtain a desired resistance of a resistor structure included in the peripheral circuits, the resistor structure may occupy a relatively large area of the. Using a large area for a resistor structure may increase the cost of the semiconductor device, limit the extent to which the device may be integrated with other components, or increase the manufacturing cost.

SUMMARY

According to example embodiments of the inventive concepts, a semiconductor device may include a substrate including a resistor region, a plurality of lower patterns in the resistor region, and a resistor line pattern on the plurality of lower patterns and the substrate of the resistor region. The plurality of lower patterns may extend in a first direction parallel to a surface of the substrate and may be arranged spaced apart from each other in a second direction perpendicular to the first direction and parallel to the surface of the substrate. The resistor line pattern may extend in the second direction. The resistor line pattern on the lower patterns may have an upper surface and a lower surface protruding in a third direction perpendicular to the surface of the substrate.

According to example embodiments of the inventive concepts, a semiconductor device may include a substrate including a cell region and a resistor region, a plurality of lower patterns in the resistor region, a resistor line pattern on the plurality of lower patterns and the substrate of the resistor region, and a cell pattern in the cell region. The plurality of lower patterns may extend in a first direction parallel to a surface of the substrate and may be arranged spaced apart from each other in a second direction perpendicular to the first direction and parallel to the surface of the substrate. The resistor line pattern may extend in the second direction. The resistor line pattern on the lower patterns may have an upper surface and a lower surface protruding in a third direction perpendicular to the surface of the substrate. The cell pattern may include a same material and a same stack structure as each of the plurality of lower patterns.

According to example embodiments of the inventive concepts, a semiconductor device may include a substrate including a cell region, a transistor region, and a resistor region, a plurality of lower patterns in the resistor region, a resistor line pattern on the plurality of lower patterns and the substrate of the resistor region, a cell pattern in the cell region, and a gate structure in the transistor region. The plurality of lower patterns may extend in a first direction parallel to a surface of the substrate and may be arranged spaced apart from each other in a second direction perpendicular to the first direction and parallel to the surface of the substrate. The resistor line pattern may extend in the second direction. The resistor line pattern on the lower patterns may have an upper surface and a lower surface protruding in a third direction perpendicular to the surface of the substrate. The cell pattern may include a same material and a same structure as each of the plurality of lower patterns.

BRIEF DESCRIPTION OF THE DRAWINGS

FIGS. 17 to 25 are cross-sectional views illustrating a method of manufacturing a semiconductor device according to example embodiments.

DETAILED DESCRIPTION OF THE EMBODIMENTS

Various example embodiments will now be described more fully with reference to the accompanying drawings in which some example embodiments are shown. However, the inventive concepts may be embodied in many alternate forms and should not be construed as limited to only example embodiments set forth herein.

The present disclosure describes embodiments of a semiconductor device that enables a level of resistance to be obtained with a relatively small resistor structure. This may enable the overall size of the device to be reduced, or to be more highly integrated. Example embodiments include a resistor structure with a wave-like shape as described below and in the accompanying figures.

Figure 1:
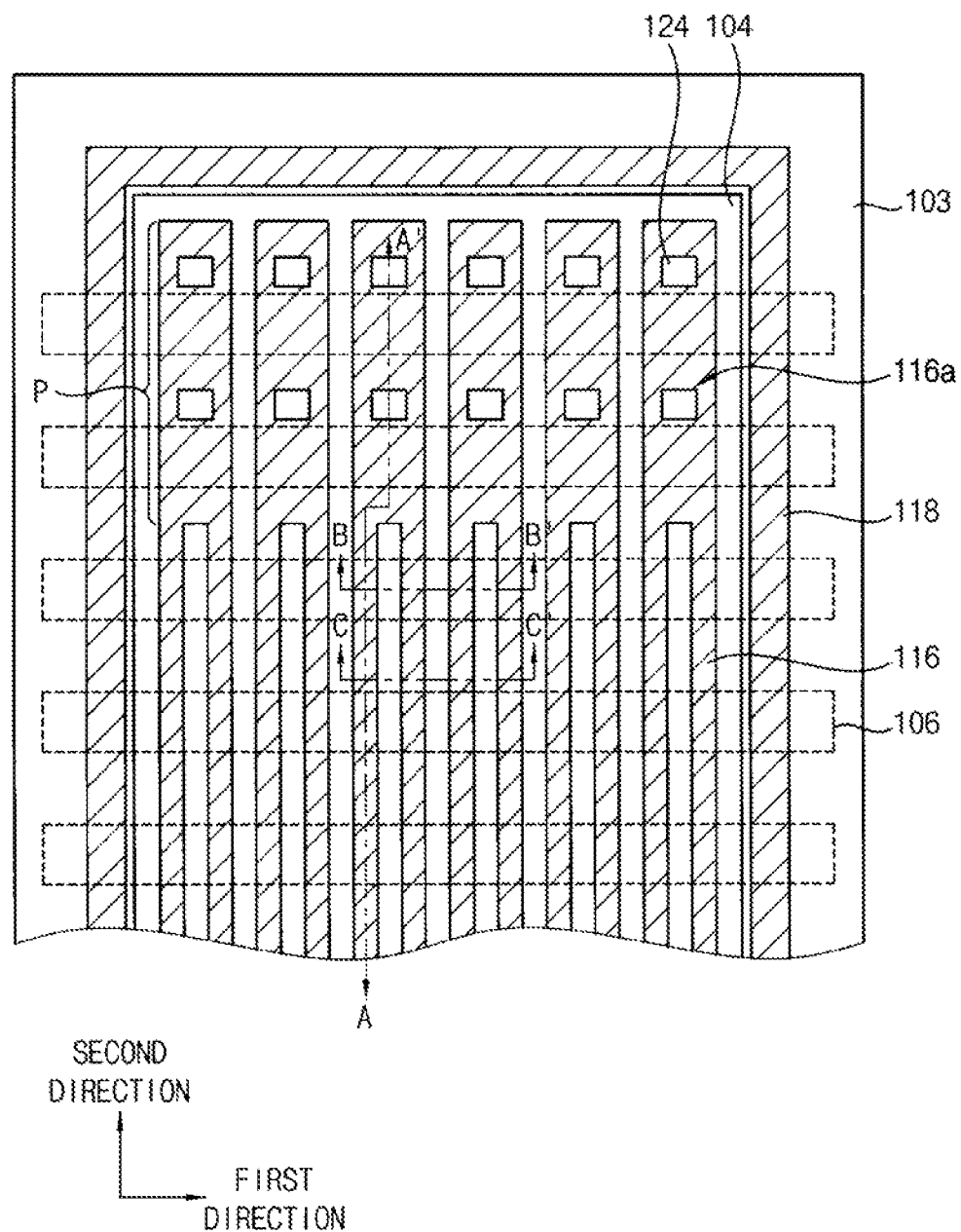
FIG. 1 is a plan view illustrating a resistor structure of a semiconductor device according to example embodiments.
Figure 2:
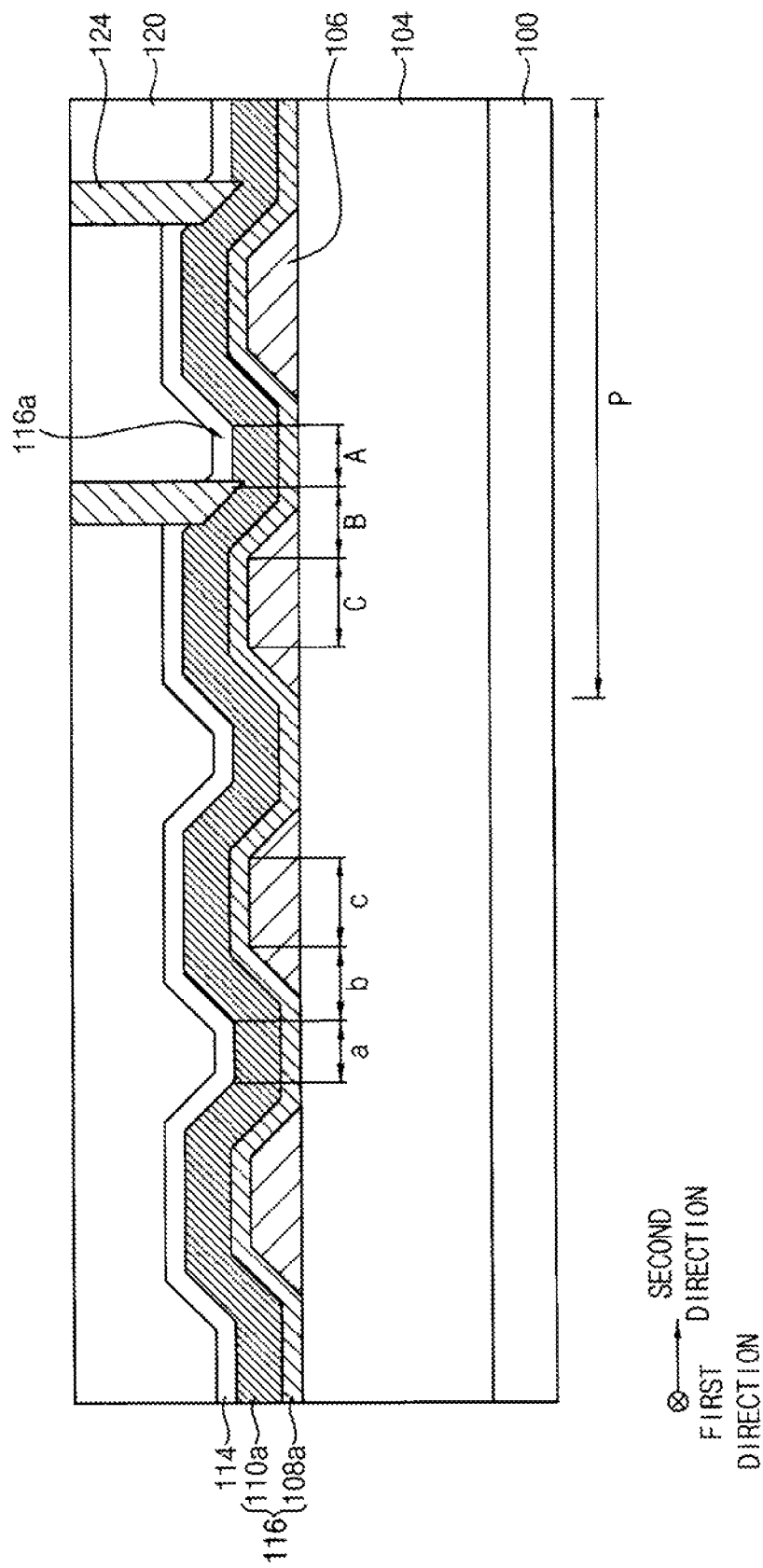
FIGS. 2, 3 and 4 are cross-sectional views illustrating a resistor structure of a semiconductor device according to example embodiments.
Figure 3:
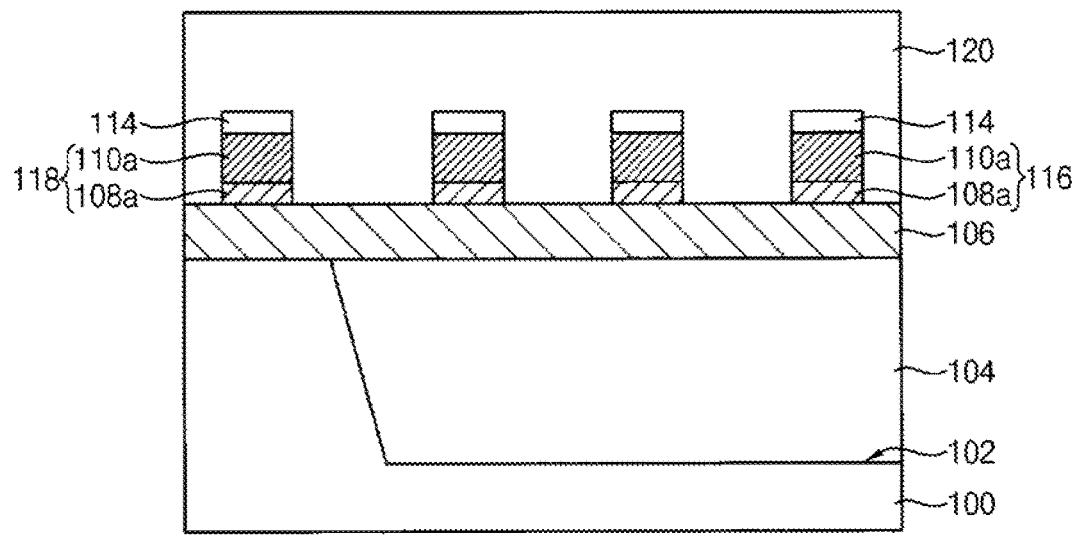
Figure 4:
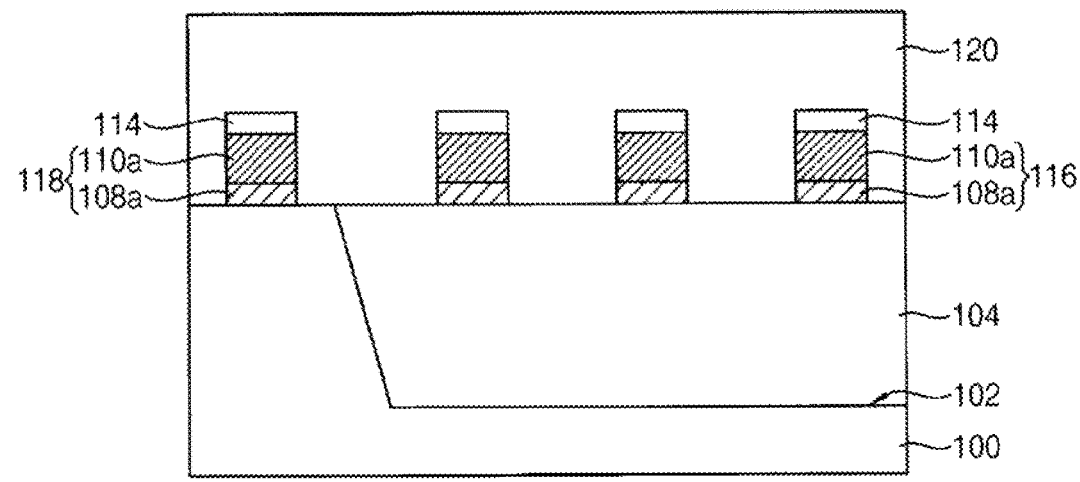

FIG. 1 is a plan view illustrating a resistor structure of a semiconductor device according to example embodiments. FIGS. 2, 3 and, 4 are cross-sectional views illustrating a resistor structure of a semiconductor device according to example embodiments. Specifically, FIG. 2 is a cross-sectional view taken along line A-A' of FIG. 1. FIG. 2 is a cross-sectional view taken along line B-B' of FIG. 1. FIG. 3 is a cross-sectional view taken along line C-C' of FIG. 1.

Hereinafter, "first direction" refers to a direction parallel to a surface of a substrate, "second direction" refers to a direction parallel to the surface of the substrate and perpendicular to the first direction, and "third direction" refers to a direction perpendicular to the surface of the substrate. In some examples, the first direction may be the direction of extension of a lower pattern of a resistor structure, and may be perpendicular to the direction of extension of one or more resistor lines.

Referring to FIGS. 1 to 4, a resistor structure of a semiconductor device may be disposed on a portion of a substrate 100 corresponding to a resistor region. The resistor structure may include lower patterns 106 and resistor line patterns 116 on the lower patterns 106. Each of resistor line patterns 116 may be disposed on an isolation pattern 104 and the lower patterns 106 may have an upper surface and a lower surface that are uneven. A mask pattern 114 may be disposed on each of the resistor line patterns 116. An interlayer insulation layer 120 may be disposed to cover the mask pattern 114, the resistor line patterns 116, the lower patterns 106 and the isolation pattern 104. A contact plug 124 may be disposed to penetrate the mask pattern 114 and the interlayer insulation layer 120 and to electrically connected to the resistor line patterns 116.

The substrate 100 may be, for example, a semiconductor substrate, such as a silicon substrate, a gallium arsenide substrate, a silicon germanium substrate. The substrate 100 may be a silicon on insulator (SOI) substrate.

The substrate 100 may include a cell region and a core/peripheral region. The resistor structure may be formed in the core/peripheral region. That is, the resistor structure may be formed within a resistor region, which may be located substantially within the core/peripheral region.

A trench 102 may be formed in the portion of the substrate 100 corresponding to the resistor region. The isolation pattern 104 may be disposed in the trench 102. The isolation pattern 104 may include an insulation material, for example, silicon oxide. The isolation pattern 104 may have a substantially flat upper surface. The isolation pattern 104 may be provided as a field region. An upper portion of the substrate 100 in which the isolation pattern 104 is not formed may be provided as an active region.

In some embodiments, a lower structure and an interlayer insulation layer covering the lower structure may be disposed on the substrate 100, and the resistor structure may be formed on the interlayer insulation layer. In this case, the resistor region may include the interlayer insulation layer on the substrate 100. In addition, the resistor structure may be spaced apart from an upper surface of the substrate 100.

In some embodiments, a guard ring 118 may be disposed on an active region 103 contacting the resistor region. The guard ring 118 may be provided to define the resistor region. The guard ring 118 may surround a perimeter of the resistor region. A material included in the guard ring 118 may be the same as a material included in the resistor line patterns 116. In some embodiments, the guard ring 118 may be excluded.

The lower patterns 106 may be disposed in the resistor region and may extend in the first direction. The lower patterns 106 may be spaced apart from each other in the second direction. The lower patterns 106 may include an insulation material, for example, silicon nitride and/or silicon oxide. Each of the lower patterns 106 may be formed of a single layer or may have a multilayer stack structure. As an example, each of the lower patterns 106 may be formed of a silicon nitride pattern. As another example, each of the lower patterns 106 may have a stack structure of a silicon nitride pattern and a silicon oxide pattern. As another example, each of the lower patterns 106 may have a stack structure of a first silicon oxide pattern, a silicon nitride pattern, and a second silicon oxide pattern.

Each of the lower patterns 106 may have a first height from a lower surface thereof to an upper surface thereof and a first width in the second direction. The lower patterns 106 may be spaced a first distance apart from each other in the second direction. Opposite sidewalls of each of the lower patterns 106 in the second direction may be sloped with respect to the surface of the substrate 100. That is, a cross section of each of the lower patterns 106 may have a trapezoidal shape. In some examples, opposite sides of each of the lower patterns 106 may have equal but opposite slopes. In other examples, opposite sides of each of the lower patterns 106 may have different slopes.

The closer the slope of the sidewall of each lower pattern 106 may be to 90 degrees, the longer the resistor line patterns 116 may be, and thus a resistance of the resistor structure may be increased. As an example, a slope angle of the sidewall of each lower pattern 106 may range from 30 to 90 degrees, but is not limited thereto.

The lower patterns 106 may determine a shape of each resistor line pattern 116 thereon. For example, if the first height of each lower pattern 106 increases, a height of a protruding portion of each resistor line pattern 116 with respect to the surface of the substrate 100 may be increased accordingly. In other words, the protruding portions of each resistor line pattern 116 may be separated from the substrate (and/or the isolation pattern 104) by one of the lower patterns 106.

If the first width of each lower pattern 106 increases, a width of the protruding portion of each resistor line pattern 116 may be increased accordingly. Similarly, if the first distance between the lower patterns 106 increases, a width of a lower portion of each resistor line pattern 116 between adjacent protruding portions of each resistor line pattern 116 may increase accordingly. In addition, a slope of the protruding portion of each resistor line pattern 116 may vary depending on the slope of the opposite sidewalls of each lower pattern 106 in the second direction.

The resistor line patterns 116 may be disposed in the resistor region and may extend in the second direction. In addition, the resistor line patterns 116 may be arranged spaced apart from each other in the first direction. Thus, the resistor line patterns 116 may be arranged in such a way that lines and spaces alternately arranged.

In each resistor line pattern 116, a portion above each lower pattern 106 may protrude from the substrate 100 (and/or the isolation pattern 104) in the third direction relative to portions of the resistor line pattern 116 that are not located directly above a lower pattern 106. In addition, in each resistor line pattern 116, a portion on the isolation pattern 104 between the lower patterns 106 may have a lower surface 102 that is below an upper surface of the substrate 100.

Each resistor line pattern 116 may include a first portion 'a' having an upper surface and a lower surface with a relatively low height with respect to the surface of the substrate 100, a third portion 'c' having an upper surface and a lower surface with relatively high height with respect to the surface of the substrate 100 (i.e., a protruding or raised portion), and a second portion 'b' connecting the first portion 'a' and the third portion 'c' and having an upper surface and a lower surface that are sloped. As the upper surface and the lower surface of each resistor line pattern 116 are uneven, a length of the upper surface of each resistor line pattern 116 in the second direction may be longer than the case in which the upper surface of each resistor line pattern 116 is flat. The increased length of the surfaces the resistor line patterns 116 may result in an increased resistance of the resistor structure in the resistor region. In addition, an area of the resistor region required for forming a resistor structure having a desired resistance may be reduced, such that the semiconductor device including the resistor structure may be more highly integrated (i.e., with other semiconductor devices or with other components).

Thus, the semiconductor device may include a plurality of lower patterns 106 in the resistor region, where the plurality of lower patterns 106 extend in a first direction parallel to a surface of the substrate and are spaced apart from each other in a second direction perpendicular to the first direction and parallel to the surface of the substrate, and where each of the plurality of lower patterns 106 include sloped sidewalls opposite each other in the second direction.

Furthermore, the plurality of resistor line patterns 116 may form the resistor structure, where each of the resistor line patterns extends in the second direction and includes a plurality of high portions disposed on the respective ones of the plurality of lower patterns 106 and a plurality of low portions disposed between the plurality of lower patterns 106, and where the high portions and the low portions of each of the resistor line patterns 116 are connected to form a wave shape configured to increase a resistance of the resistor structure (i.e., compared to resistor line patterns not having the wave shape).

In some embodiments, the resistor line patterns 116 may include a resistor material, for example, metal, metal silicide, metal nitride, or a semiconductor material. For example, the resistor line patterns 116 may include tungsten, tungsten silicide, tungsten nitride, tungsten nitride, titanium, titanium silicide, titanium nitride, tantalum, tantalum silicide, tantalum nitride, and/or polysilicon. Each of the resistor line patterns 116 may be formed of one layer or two or more stacked layers.

As shown in the drawings, each resistor line pattern 116 may have a stack structure of a lower resistor pattern and an upper resistor pattern. For example, each resistor line pattern 116 may have a stack structure of a polysilicon pattern 108a and a tungsten silicide pattern 110a.

In the resistor region, a region adjacent to an end portion of each resistor line pattern 116 in the second direction may be provided as a contact region P for forming a contact plug 124.

In some embodiments, in the contact region P, end portions of adjacent resistor line patterns 116 may be merged to form a merged resistor line 116a having an increasing width in the first direction. For example, the merged resistor line 116a may be provided when it is difficult to form the contact plug 124 on each resistor line pattern 116 (e.g., due to a narrow width of each resistor line pattern 116). Thus, in some cases the contact plug 124 may be disposed on the merged resistor line 116a.

In some embodiments, the merged resistor line 116a may be omitted. For example, the resistor line patterns 116 may extend to a region proximate to a perimeter of the resistor region. In this case, the contact plug 124 may be disposed on the resistor line patterns 116.

The mask pattern 114 on each of the resistor line patterns 116 may include an insulation material.

The interlayer insulation layer 120 may cover the mask pattern 114, the resistor line patterns 116, the lower patterns 106, the isolation pattern 104, the guard ring 118. The interlayer insulation layer 120 may have an upper surface higher than the upper surfaces of the resistor line patterns 116 with respect to the upper surface of the isolation pattern 104. In some examples, the interlayer insulation layer 120 may have a flat upper surface. The interlayer insulation layer 120 may include silicon oxide.

The contact plug 124 may contact an upper surface of the merged resistor line 116a or the upper surface of the resistor line pattern 116 that is positioned in the contact region P. Hereinafter, it will be described that the contact plug 124 may be disposed on the merged resistor line 116a in the contact region P.

In some embodiments, the lower patterns 106 may be disposed under the merged resistor line 116a. In this case, the merged resistor line 116a may have an uneven upper surface and an uneven lower surface.

In some embodiments, the merged resistor line 116a may include a first portion A having an upper surface and a lower surface with a relatively low height with respect to the surface of the substrate 100, a third portion C having an upper surface and a lower surface with a relatively high height with respect to the surface of the substrate 100, and a second portion B connecting the first portion A and the third portion C and having an upper surface and a lower surface that are sloped.

In some embodiments, the contact plug 124 may contact the second portion B of the merged resistor line 116a. Since a lower surface of the contact plug 124 contacts a sloped surface of the merged resistor line 116a, the lower surface of the contact plug 124 may be sloped (as opposed to being flat or planarized). Thus, an area of the lower surface of the contact plug 124 may be increased. As such, as the area of the lower surface of the contact plug 124 increases, a contact resistance of the contact plug 124 may be reduced.

When a slope angle of the second portion B of the merged resistor line 116a is 90 degrees, it may be difficult to form the contact plug 124 exposing the second portion B of the merged resistor line 116a. Thus, the slope angle of the second portion B of the merged resistor line 116a may be less than 90 degrees, for example, between 30 and 90 degrees.

In some embodiments, at least one contact plug 124 may contact the first portion A or the third portion C, of the merged resistor line 116a. For example, at least one contact plug 124 may contact a planar portion of the merged resistor line 116a.

FIGS. 5 to 12 are cross-sectional views illustrating a method of forming a resistor structure of a semiconductor device according to example embodiments. Specifically, FIGS. 5, 7, 9, and 11 are cross-sectional views taken along line A-A' of FIG. 1. FIGS. 6, 8, 10, and 12 are cross-sectional views taken along line B-B' of FIG. 1.

Figure 5:
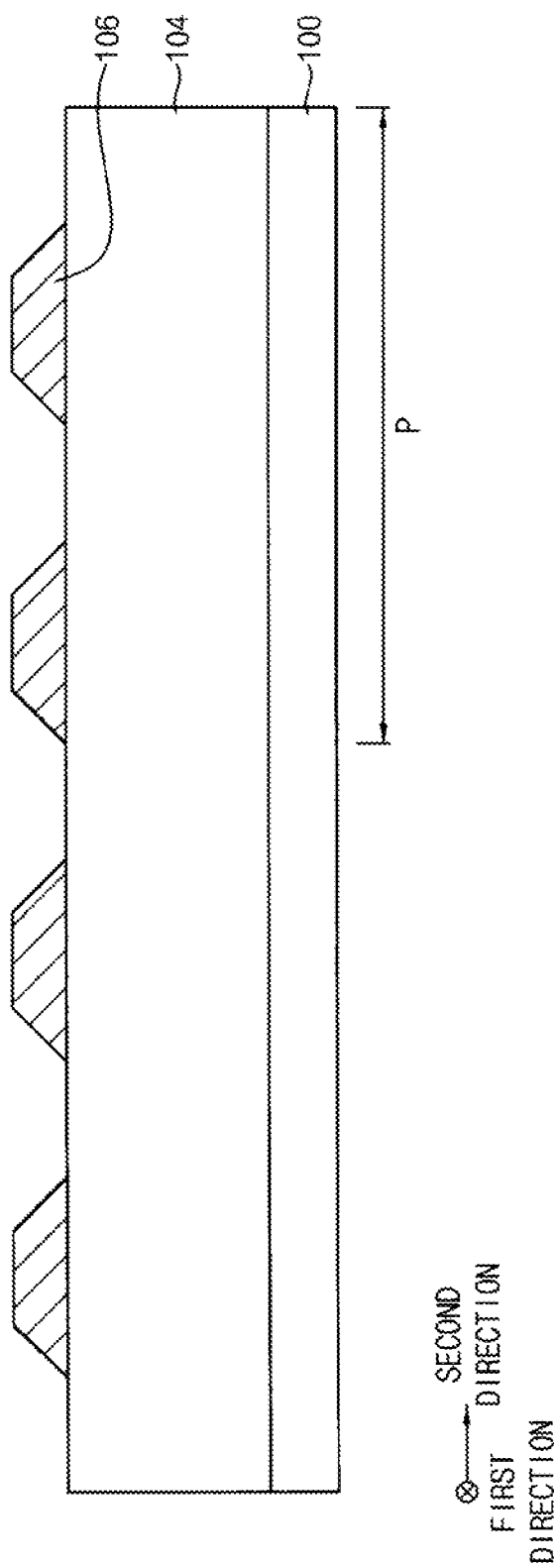
FIGS. 5 to 12 are cross-sectional views illustrating a method of forming a resistor structure of a semiconductor device according to example embodiments.
Figure 6:
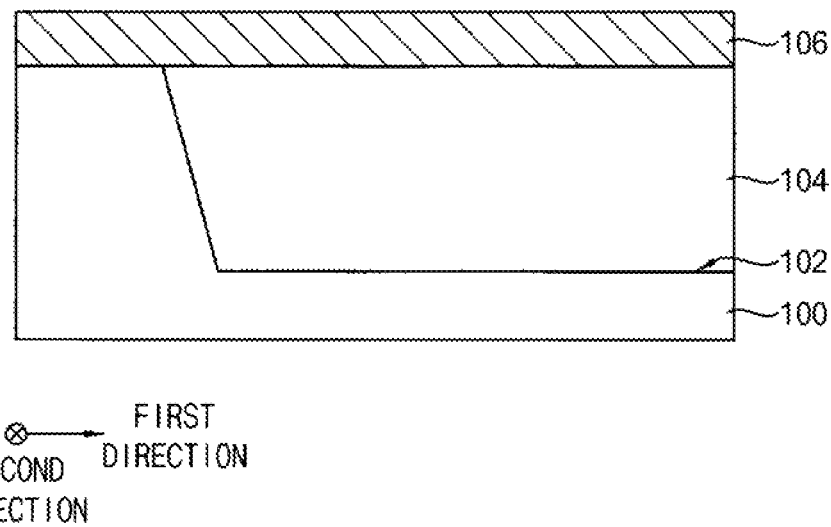

Referring to FIGS. 5 and 6, an isolation process may be performed on the substrate 100 to define an isolation region and an active region. The isolation process may include a shallow trench isolation (STI) process. For example, a trench 102 may be formed in the substrate 100 of the isolation region, and then the isolation pattern 104 may be formed in the trench 102.

In some embodiments, the isolation pattern 104 may be formed in a resistor region for forming a resistor structure. For example, the resistor structure may be formed on the isolation pattern 104. The isolation pattern 104 may include an insulation material, for example, silicon oxide. In some embodiments, the isolation pattern 104 may have a flat upper surface.

In some embodiments, a lower structure and an interlayer insulation layer covering the lower structure may be disposed, and the resistor structure may be formed on the interlayer insulation layer. In this case, the same process as described later may be performed on the interlayer insulation layer to form the resistor structure.

A lower layer may be formed on the substrate 100 and the isolation pattern 104, and then the lower layer may be patterned to form the lower patterns 106 on the isolation pattern 104 in the resistor region.

The lower layer may include an insulation material, for example, silicon nitride/or silicon oxide. The lower layer may be formed of one layer or multiple layers. Thus, the lower patterns 106 may each have a single pattern or a multilayer stack structure.

The lower patterns 106 may extend in the first direction and may be spaced apart from each other in the second direction.

The lower patterns 106 may be provided to form the resistor line pattern (e.g., the resistor line patterns 116 of FIG. 9) having a wave shape in the following process. Thus, a height, width, space, and sidewall slope of the lower patterns 106 may be varied according to a desired shape of the resistor line pattern.

In some embodiments, each of the lower patterns 106 may have sloped sidewalls in the second direction. The sloped opposite sidewalls of each lower pattern 106 may be symmetrical to each other with respect to a vertical center line of each lower pattern 106 extending in the third direction.

The closer a slope angle of the sidewall of each lower pattern 106 may be to 90 degrees, the longer the resistor line pattern may be (e.g., the resistor line patterns 116 of FIG. 9), which may increase a resistance of the resistor structure. As an example, the slope angle of the sidewall of each lower pattern 106 may range from 30 to 90 degrees (measured from the plane of an upper surface of the substrate 100 and/or the isolation pattern 104), but is not limited thereto.

In some embodiments, the lower patterns 106 may also be formed in a contact region P included in the resistor region. In this case, the semiconductor device as described with reference to FIGS. 1 to 4 may be formed by the following process.

Figure 7:
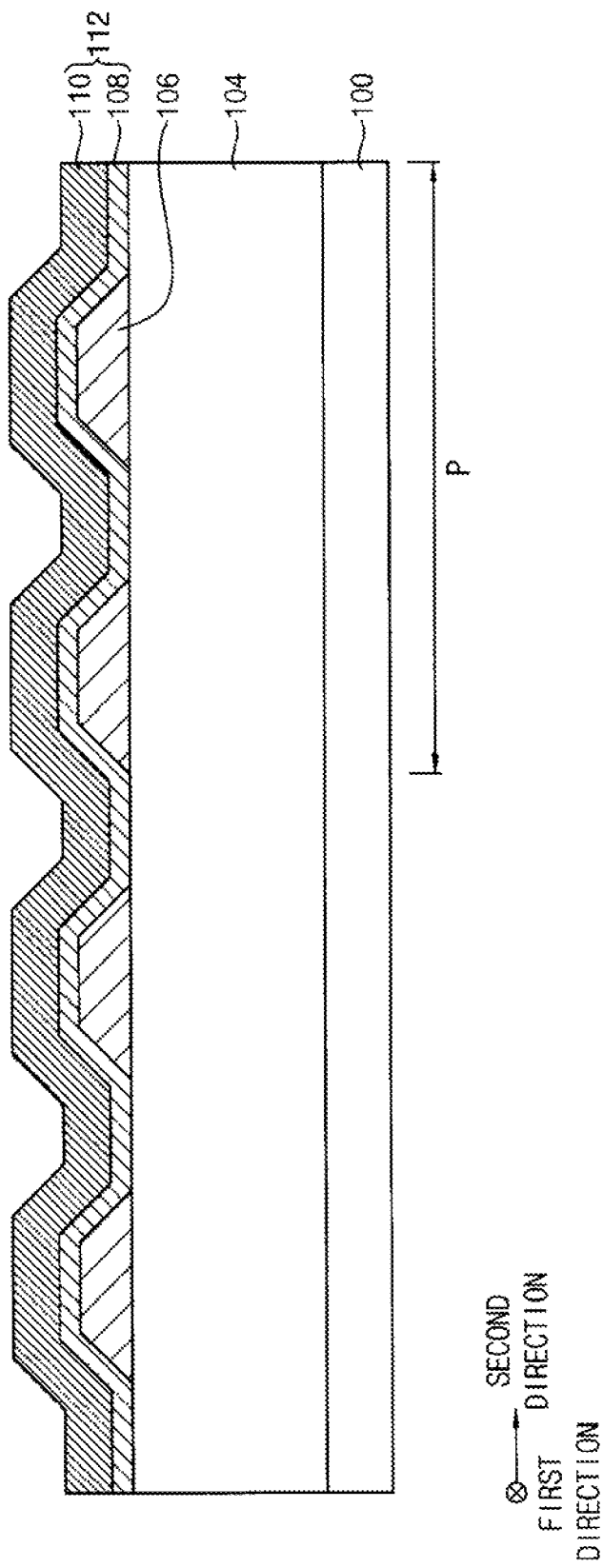
Figure 8:
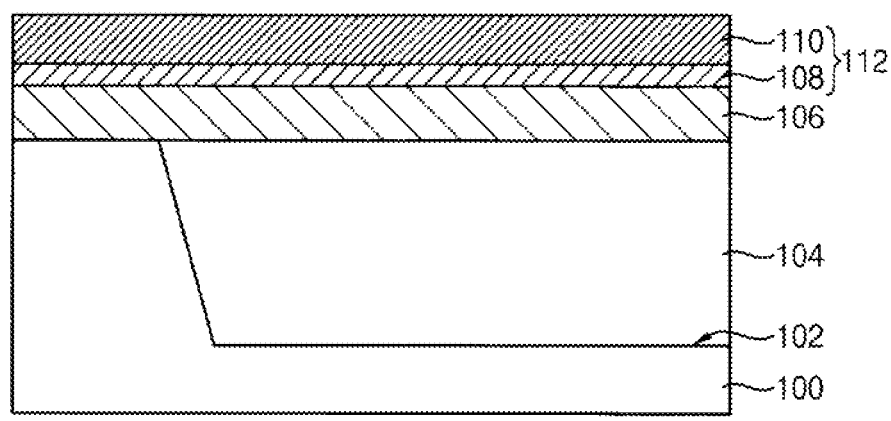

Referring to FIGS. 7 and 8, a resistor layer 112 may be formed on the isolation pattern 104, the lower patterns 106, and the substrate 100.

In the resistor region, the resistor layer 112 may be conformally formed along surfaces of the isolation pattern 104 and the lower patterns 106. Thus, an upper surface and a lower surface of some portions of the resistor layer 112 on the lower patterns 106 may have a shape that protrudes in the third direction (i.e., further separated from the substrate 100 and/or the isolation pattern 104), and an upper surface and a lower surface of other portions of the resistor layer 112 on the isolation pattern 104 between the lower patterns 106 may have a relatively sunken shape (i.e., in contact with or less separated from the substrate 100 and/or the isolation pattern 104). Thus, the upper surface (and/or the lower surface) of the resistor layer 112 may be uneven.

In some embodiments, the resistor layer 112 may include a material configured to obtain a desired resistance, for example, metal, metal silicide, metal nitride, or a semiconductor material. The resistor layer 112 may be formed of one layer or multiple layers. For example, the resistor layer 112 may be formed by stacking a polysilicon layer 108 and a tungsten silicide layer 110.

Figure 9:
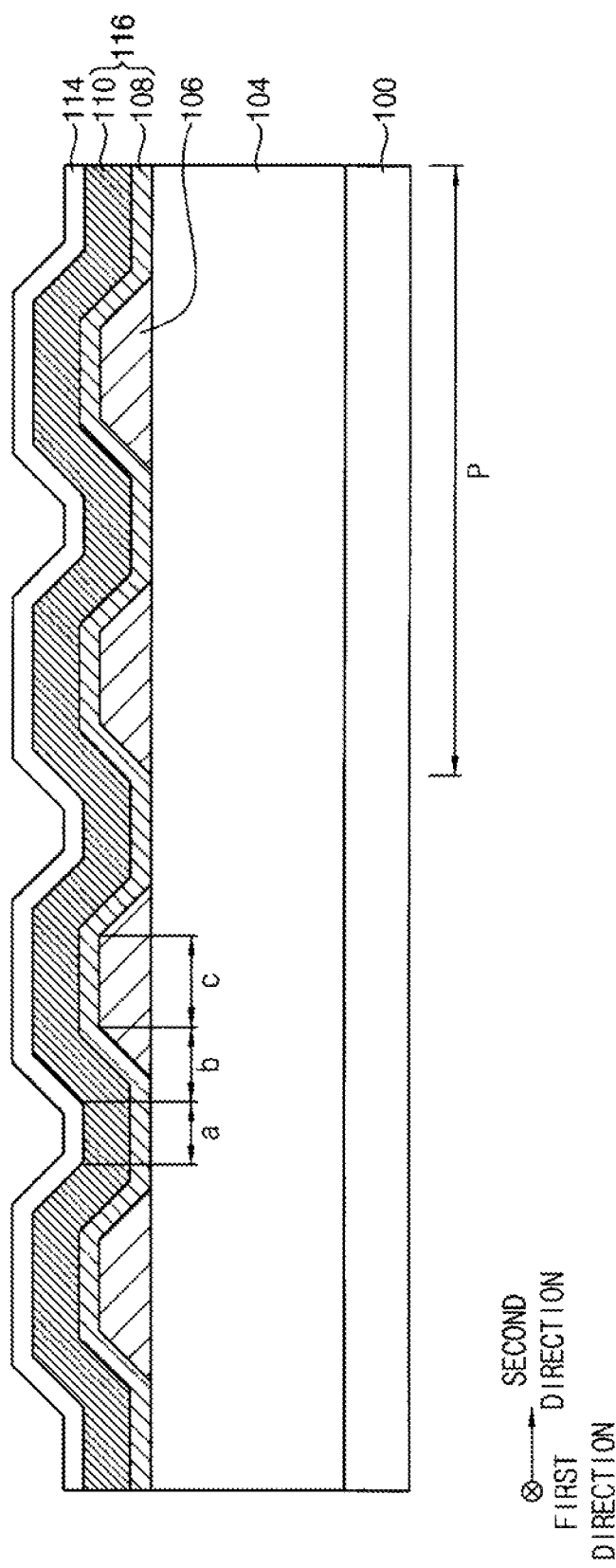
Figure 10:
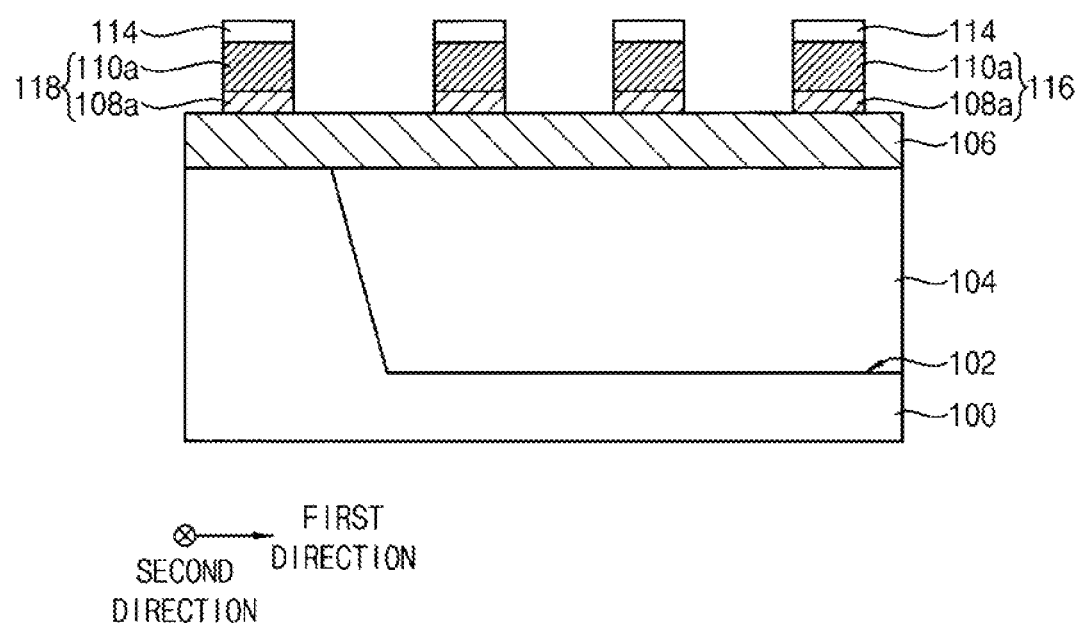

Referring to FIGS. 9 and 10, a mask pattern 114 may be formed on the resistor layer 112. The resistor layer 112 may be patterned using the mask pattern 114 as an etch mask to form the resistor line pattern 116 extending in the second direction. A portion of the resistor layer 112 on the active region of the substrate 100 adjacent to the resistor region may be patterned to form the guard ring 118 surrounding the resistor region. Thus, the resistor line pattern 116 and the guard ring 118 may include a same material and/or may have a same stack structure.

In some embodiments, the resistor line pattern 116 and the guard ring 118 may have a stack structure of a polysilicon pattern 108a and a tungsten silicide pattern 110a.

In the resistor region, a plurality of resistor line patterns 116 may be formed. The plurality of resistor line patterns 116 may be spaced apart from each other in the first direction. Thus, the resistor line patterns 116 may be arranged in such a way that lines and spaces are alternately arranged.

Each of the resistor line patterns 116 may include a first portion 'a' having an upper surface and a lower surface extending in the second direction that are lower with respect to the surface of the substrate 100, a third portion 'b' having an upper surface and a lower surface extending in the second direction that are higher with respect to the surface of the substrate 100, and a second portion 'b' connecting the first portion 'a' and the third portion 'c', between the first portion 'a' and the third portion 'c', and having an upper surface and a lower surface that are sloped.

In some embodiments, as shown in FIG. 1, end portions of adjacent resistor line patterns 116 may be merged adjacent to the contact region P to form a merged resistor line (e.g., the merged resistor line 116a FIG. 1) having an increased width in the first direction, In some embodiments, the merged resistor line may be omitted, and the resistor line patterns 116 may extend to a region close to a perimeter of the resistor region.

Figure 11:
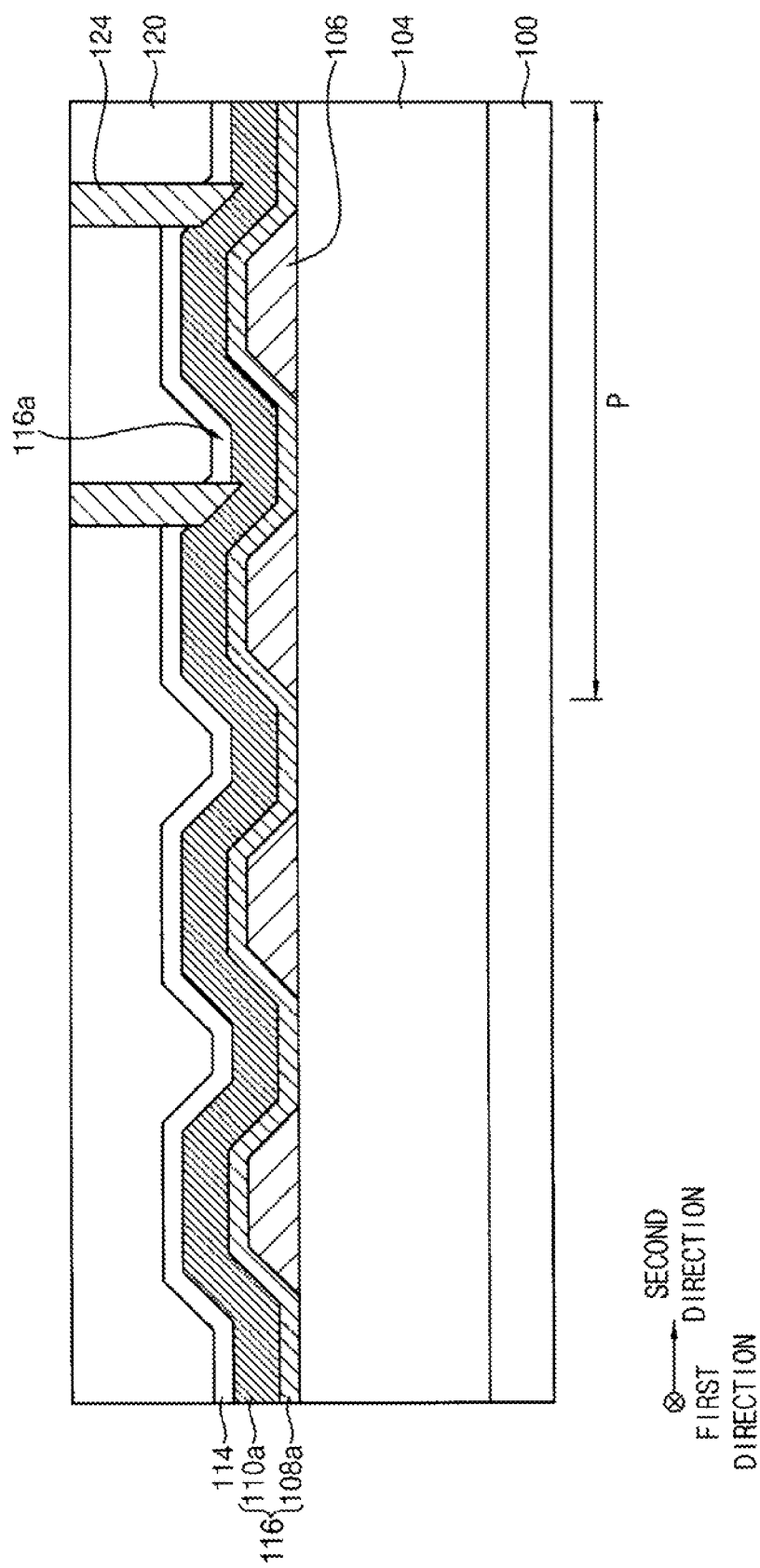
Figure 12:
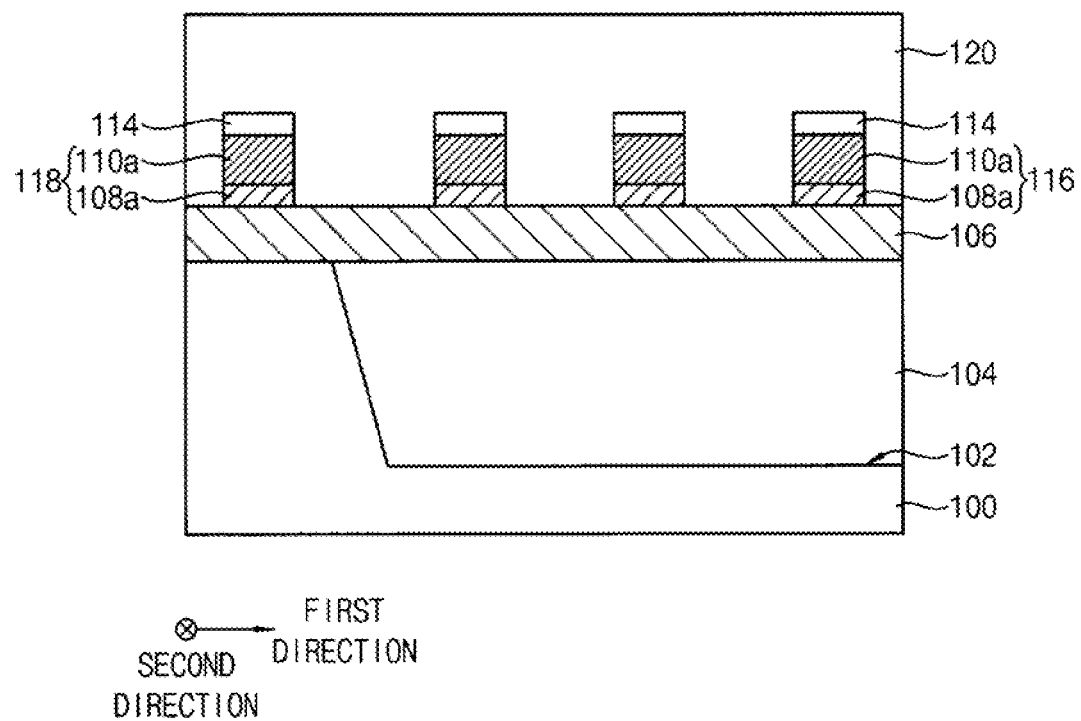

Referring to FIGS. 11 and 12, the interlayer insulation layer 120 may be formed to cover the resistor line pattern 116, the lower patterns 106, the isolation pattern 104, and the guard ring (e.g., guard ring 118 of FIGS. 1 and 3). The contact plug 124 may penetrate the interlayer insulation layer 120 and the mask pattern 114 to be electrically connected to the resistor line pattern 116.

The interlayer insulation layer 120 may be formed by depositing a silicon oxide layer and then planarizing an upper surface of the silicon oxide layer. The planarization may be performed by a chemical mechanical polishing process and/or an etch back process.

To form the contact plug 124, a portion of the interlayer insulation layer 120 may be etched to form a contact hole. In some embodiments, a lower surface of the contact hole may expose a sloped upper surface of the second portion (e.g., the second portion B of FIG. 2) of the merged resistor line 116a or the sloped upper surface of the second portion (e.g., the second portion 'b' of FIG. 9) of the resistor line pattern 116. In the case in which a slope angle of the upper surface of the second portion of the merged resistor line 116a (or the resistor line pattern 116) is 90 degrees, it may be difficult to form a contact hole exposing the second portion of the merged resistor line 116a (or the resistor line pattern 116). Thus, the slope angle of the upper surface of the second portion of the merged resistor line 116a (or the resistor line pattern 116) may be less than 90 degrees, for example, in a range from 30 to 80 degrees.

The contact plug 124 may include metal. For example, the contact plug 124 may include a barrier metal pattern and a metal pattern.

As a lower surface of the contact plug 124 may contact the sloped upper surface of the resistor line pattern 116 (or the merged resistor line 116a), a contact area between the lower surface of the contact plug 124 and the underlying layer may be increased. Thus, the contact resistance of the contact plug 124 may be reduced.

In some embodiments, the resistor structure of the semiconductor device may have various structures depending on a shape of the lower patterns. Hereinafter, the resistor structures (which may change according to the shape of the lower patterns) will be described.

Figure 13:
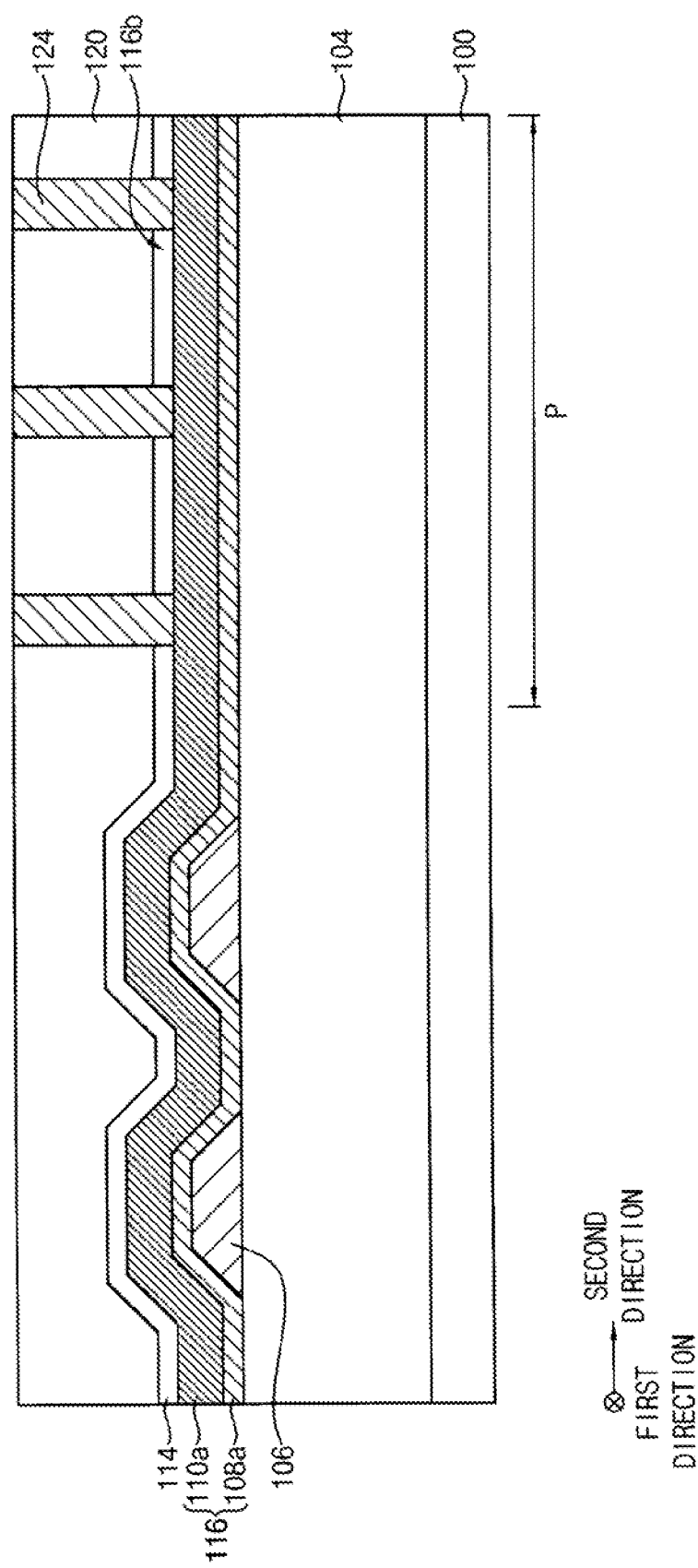
FIG. 13 is a cross-sectional view illustrating a resistor structure of a semiconductor device according to example embodiments.

FIG. 13 is a cross-sectional view illustrating a resistor structure of a semiconductor device according to example embodiments.

A semiconductor device shown in FIG. 13 may be the same as the semiconductor device described with reference to FIGS. 1 to 4 except for a contact region.

Referring to FIG. 13, the lower patterns 106 may not be disposed in the contact region P. A merged resistor line 116b may be formed on a planar upper surface of the isolation pattern 104 within the contact region P. An upper surface and a lower surface of the merged resistor line 116b may be flat (i.e., without having an uneven portion due to being disposed over the lower patterns 106). The contact plug 124 may contact the upper surface of the flat merged resistor line 116b.

The resistor structure shown in FIG. 13 may be formed by the same processes as those described with reference to FIGS. 5 to 12. However, when the processes described with reference to FIGS. 5 and 6 are performed, the lower patterns may not be formed in the contact region P in the resistor region. Thus, a merged resistor line 116b having flat lower and upper surfaces may be formed, and a contact plug 124 having a flat lower surface may be formed.

Figure 14:
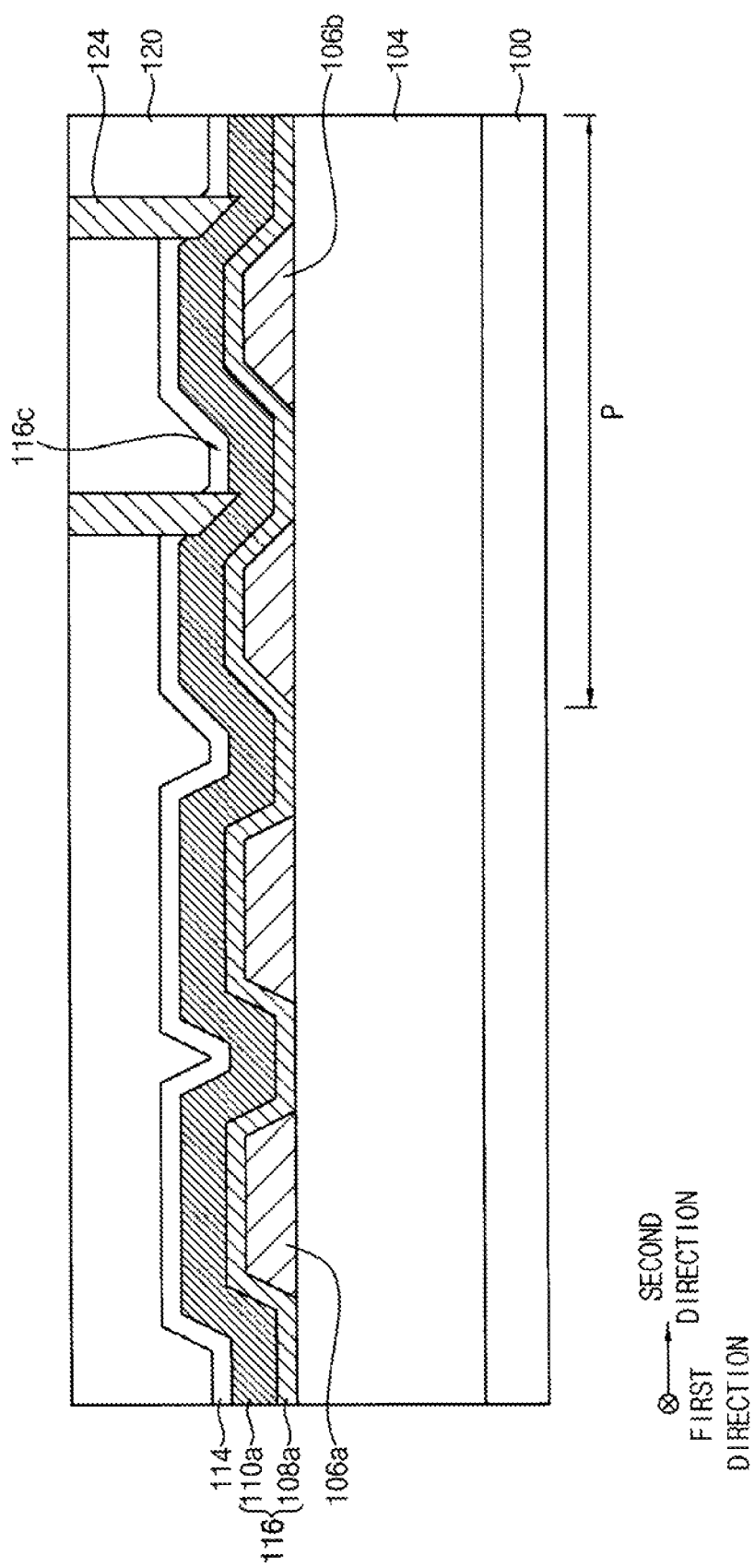
FIG. 14 is a cross-sectional view illustrating a resistor structure of a semiconductor device according to example embodiments.

FIG. 14 is a cross-sectional view illustrating a resistor structure of a semiconductor device according to example embodiments.

A semiconductor device shown in FIG. 14 may be the same as the semiconductor device described with reference to FIGS. 1 to 4 except for the shape of the lower patterns (and, hence, the shape of the resistor line pattern).

Referring to FIG. 14, first lower patterns 106a may be disposed in a resistor region, except for within the contact region P, and second lower patterns 106b may be disposed in the contact region P. The first and second lower patterns 106a and 106b may include the same material. However, the first and second lower patterns 106a and 106b may have different shapes (and may also have different spacing from one another).

For example, the sidewalls of each of the first lower patterns 106a in the second direction may have a first slope, and the sidewalls of each of the second lower patterns 106b may have a second slope gentler than the first slope (i.e., having a smaller angle measured with respect to the plane of the upper surface of the substrate 100 and/or the isolation pattern 104).

The resistor line pattern 116 on the first lower patterns 106a may have a protruding portion. The protruding portion may have substantially the same first slope as the sidewalls of the first lower patterns 106a.

In some embodiments, the merged resistor line 116c may be disposed on the second lower patterns 106b. The merged resistor line 116c may also include a protruding portion. The protruding portion may have substantially the same second slope as the sidewalls of the second lower patterns 106b. In other words, the protruding portions of the merged resistor line 116c may have a slope gentler than that of the resistor line pattern 116.

In some embodiments, the merged resistor line 116c may not be disposed on the second lower patterns 106b, and the resistor line pattern 116 may extend to the contact region P. In this case, a protruding portion of the resistor line pattern 116 in the contact region P may have a relatively gentle slope (compared to the slope of the same resistor line pattern 116 outside of the contact region P).

As such, the slope of the protruding portion of the resistor line pattern 116 in the contact region P or the slope of the protruding portion of the merged resistor line 116c may be different from the slope of the protruding portion of the resistor line pattern 116 in the resistor region outside the contact region P.

In some embodiments, a distance between the first lower patterns 106a may differ from a distance between the second lower patterns 106b.

The interlayer insulation layer 120 may be disposed to cover the mask pattern 114, the first lower patterns 106a, the second lower patterns 106b, the isolation pattern 104, the resistor line pattern 116, the merged resistor line 116c, and the guard ring (e.g., the guard ring 118 of FIG. 3). The contact plug 124 may be disposed to penetrate the interlayer insulation layer 120 and the mask pattern 114 and to contact the sloped surface of the merged resistor line 116c.

As the first lower patterns 106a have the first slope, a length of the upper surface of the resistor line pattern 116 in the second direction may increase. In addition, as the second lower patterns 106b have the second slope gentler than the first slope, the contact plug 124 may be more easily formed on the sloped upper surface of the merged resistor line 116c.

Figure 15:
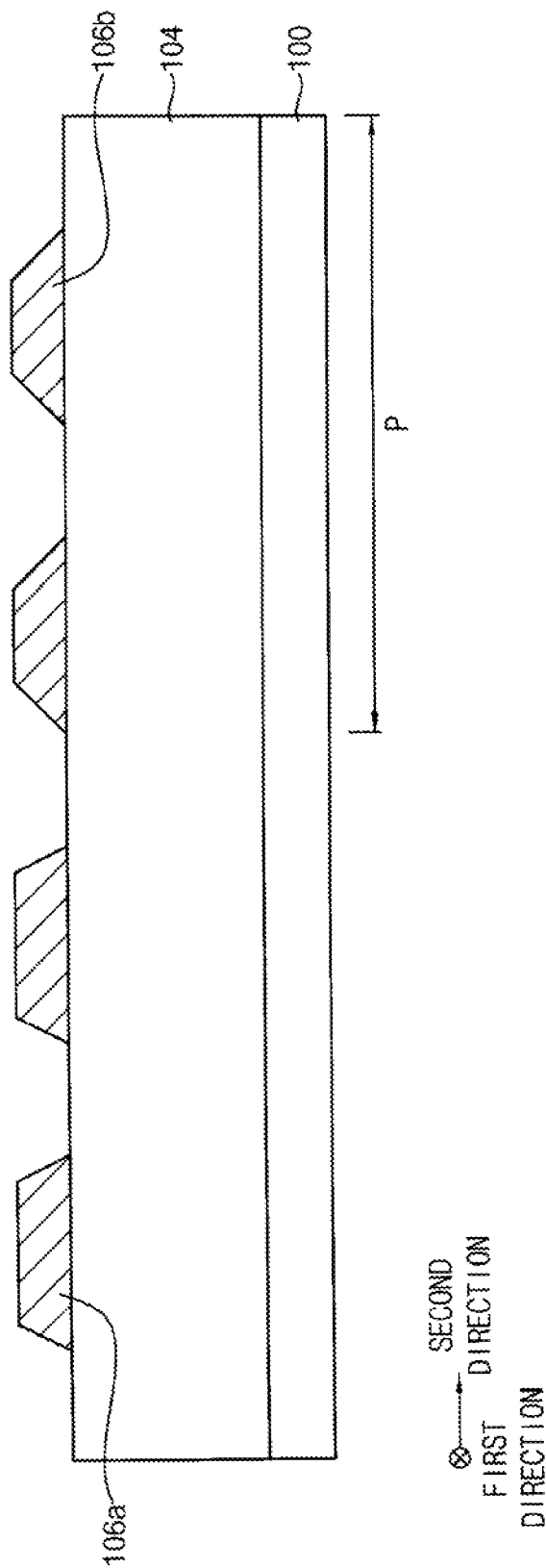
FIG. 15 is a cross-sectional view illustrating a method of forming a resistor structure of a semiconductor device according to example embodiments.

FIG. 15 is a cross-sectional view illustrating a method of forming a resistor structure of a semiconductor device according to example embodiments. Specifically, the method illustrated by FIG. 15 may include forming first lower patterns 106a and second lower patterns 106b having different shapes (and, in some cases, different spacing).

Referring to FIG. 15, an isolation process may be performed on the substrate 100 to define an isolation region and an active region. A trench may be formed in the substrate 100 of the isolation region, and then the isolation pattern 104 may be formed in the trench. The isolation process may be the same as that described with reference to FIGS. 5 and 6.

A lower layer may be formed on the substrate 100. The lower layer may be patterned to form the first lower patterns 106a and the second lower patterns 106b in the resistor region of the substrate 100. For example, the second lower patterns 106b may be formed in the contact region P of the resistor region, and the first lower patterns 106a may be formed in the resistor region outside the contact region.

In some embodiments, a portion of the lower layer in the resistor region may be etched to form preliminary lower patterns (not shown), and then sidewalls of the preliminary lower patterns in the contact region P may be further etched to form the first lower patterns 106a and the second lower patterns 106b.

Thereafter, the same processes as those described with reference to FIGS. 7 to 12 may be performed, thus forming the resistor structure of the semiconductor device shown in FIG. 14.

Figure 16:
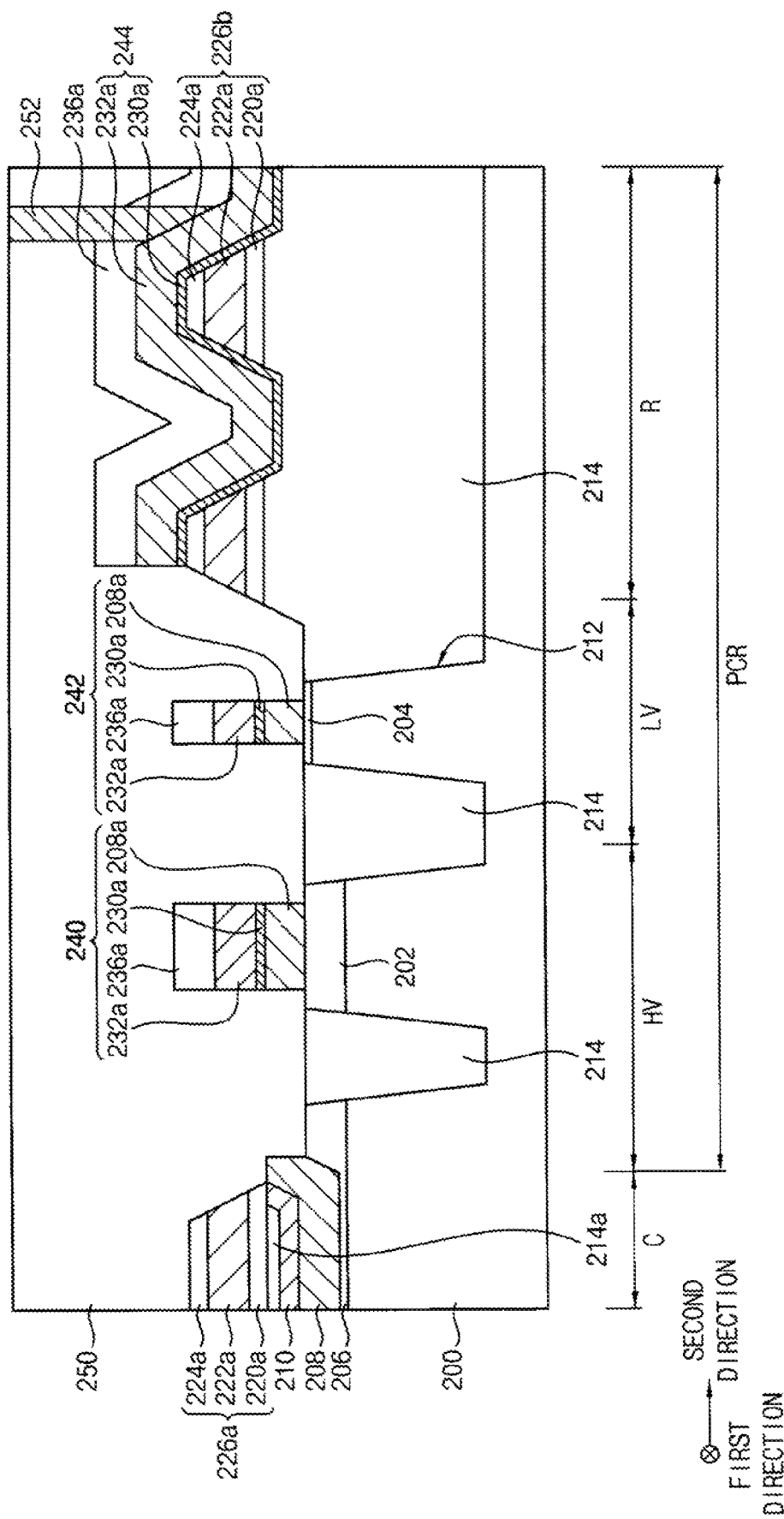
FIG. 16 is a cross-sectional view illustrating a semiconductor device according to example embodiments.

FIG. 16 is a cross-sectional view illustrating a resistor structure of a semiconductor device according to example embodiments.

Referring to FIG. 16, a semiconductor device may be formed on a substrate 200 including a first region C and a second region PCR. The first region C may be a cell region, and the second region PCR may be a peripheral circuit region PCR. The second region PCR may include a high voltage transistor region HV, a low voltage transistor region LV, and a resistor region R.

A cell pattern 226a constituting a portion of a memory cell may be disposed in the cell region C.

A first gate insulation layer 202, and a first gate structure 240 on the first gate insulation layer 202 may be disposed in the high voltage transistor region HV. The first gate structure 240 may have a stack structure of a first gate pattern and a mask pattern 236a. A second gate insulation layer 204 and a second gate structure 242 on the second gate insulation layer 204 may be disposed in the lower voltage transistor region LV. The second gate structure 242 may have a stack structure of a second gate pattern and the mask pattern 236a.

Lower patterns 226b and resistor line patterns 244 may be disposed in the resistor region R. The mask pattern 236a may be disposed on each of the resistor line patterns 244. The resistor line patterns 244 may be disposed on the substrate 200 and the lower patterns 226b, and upper surfaces and lower surfaces of the resistor line patterns 244 may be uneven (i.e., in the wave shape described herein). An interlayer insulation layer 250 may be disposed to cover the mask pattern 236a, the lower patterns 226b, the cell pattern 226a, and the first and second gate structures 240 and 242. A contact plug 252 may be disposed to penetrate the interlayer insulation layer 250 and the mask pattern 236a and to be electrically connected to the resistor line patterns 244.

An isolation trench 212 may be disposed in the substrate 200. An isolation pattern 214 may be disposed in the isolation trench 212. The substrate 200 may be divided into an isolation region and an active region by the isolation pattern 214. The isolation pattern 214 may be formed in the isolation region in each of the first and second regions C and PCR. An upper portion of the substrate 200 in which the isolation pattern 214 is not formed may be provide as the active region.

In some embodiments, an upper surface of the active region in the first region C and the high voltage transistor region HV may be lower than an upper surface of the active region in the low voltage transistor region LV.

In some embodiments, the first gate structure 240 and the second gate structure 242 may be formed on the active region in the second region PCR. The resistor region R may include the isolation pattern 214.

In some embodiments, the lower patterns 226b and the resistor line patterns 244 in the resistor region R may be the same as or similar to those described with reference to FIGS. 1 to 4. In some embodiments, the lower patterns 226b and each of the resistor line patterns 244 in the resistor region R may be the same as or similar to those described with reference to FIG. 13. In some embodiments, the lower patterns 226b and each of the resistor line patterns 244 in the resistor region R may be the same as or similar to those described with reference to FIG. 14.

The lower patterns 226b may be disposed in the resistor region R. The lower patterns 226b may extend in the first direction and may be spaced apart from each other in the second direction. The lower patterns 226b may include the same material as an insulation layer or an insulation pattern included in the cell pattern 226a. In some embodiments, the lower patterns 226b may have the same stack structure as the cell pattern 226a.

In some embodiments, the lower patterns 226b may include an insulation material, for example, silicon nitride and/or silicon oxide. Each of the lower patterns 226b may have a one-layer structure or a multilayer stack structure. For example, each of the lower patterns 226b may include a lower oxide pattern 220a, a nitride pattern 222a, and an upper oxide pattern 224a.

The resistor line patterns 244 may be disposed on the isolation pattern 214 and the lower patterns 226b in the resistor region R. The resistor line patterns 244 may extend in the second direction and may be spaced apart from each other in the first direction. In each of the resistor line patterns 244, a portion on the lower patterns 226b may protrude in the third direction (i.e., relative to the substrate 200), and another portion (i.e., a portion disposed on the isolation pattern 214, between the lower patterns 226b) may have relatively low upper and lower surfaces.

The resistor line patterns 244 may include a material to form a resistor structure having a desired resistance, for example, metal, metal silicide, metal nitride, a semiconductor material. Each of the resistor line patterns 244 may have a stack structure of a lower resistor pattern and an upper resistor pattern. For example, each of the resistor line patterns 244 may have a structure in which a polysilicon pattern 230a and a tungsten silicide pattern 232a are stacked.

A width of the first gate structure 240 may be larger than a width of the second gate structure 242.

A thickness of the first gate insulation layer 202 may be greater than a thickness of the second gate insulation layer 204. The first gate pattern and the second gate pattern may have the same stack structure. In some embodiments, the first gate pattern and the second gate pattern may include the same material as a material included in the resistor line patterns 244. As an example, the first gate pattern and the second gate pattern may have a structure in which a material pattern included in each of the resistor line patterns 244 may be stacked on a lower polysilicon pattern 208a. Thus, when each of the resistor line patterns 244 has a stack structure including the polysilicon pattern 230a and the tungsten silicide pattern 232a, the first gate pattern and the second gate pattern may each have a stack structure of the lower polysilicon pattern 208a, the polysilicon pattern 230a, and the tungsten silicide pattern 232a.

The mask pattern 236a included in the first and second gate structures 240 and 242 may include the same material as the mask pattern 236a on the resistor line patterns 244.

In the second region PCR, the same structure as the lower patterns 226b may not be disposed in a remaining region other than the resistor region R. For example, the same structure as the lower patterns 226b may not be disposed in the high voltage transistor region HV and the low voltage transistor region LV.

The semiconductor device may include a memory device, for example, a vertical NAND flash memory device, a planar type flash memory device, a DRAM device, or an SRAM device. According to a kind, structure, or configuration of the semiconductor device, the stack structure of the cell pattern 226a in the first region C (i.e., cell region) may be changed. Thus, the stack structure of each of the lower patterns 226b may be changed.

FIGS. 17 to 25 are cross-sectional views illustrating a method of manufacturing a semiconductor device according to example embodiments.

Figure 17:
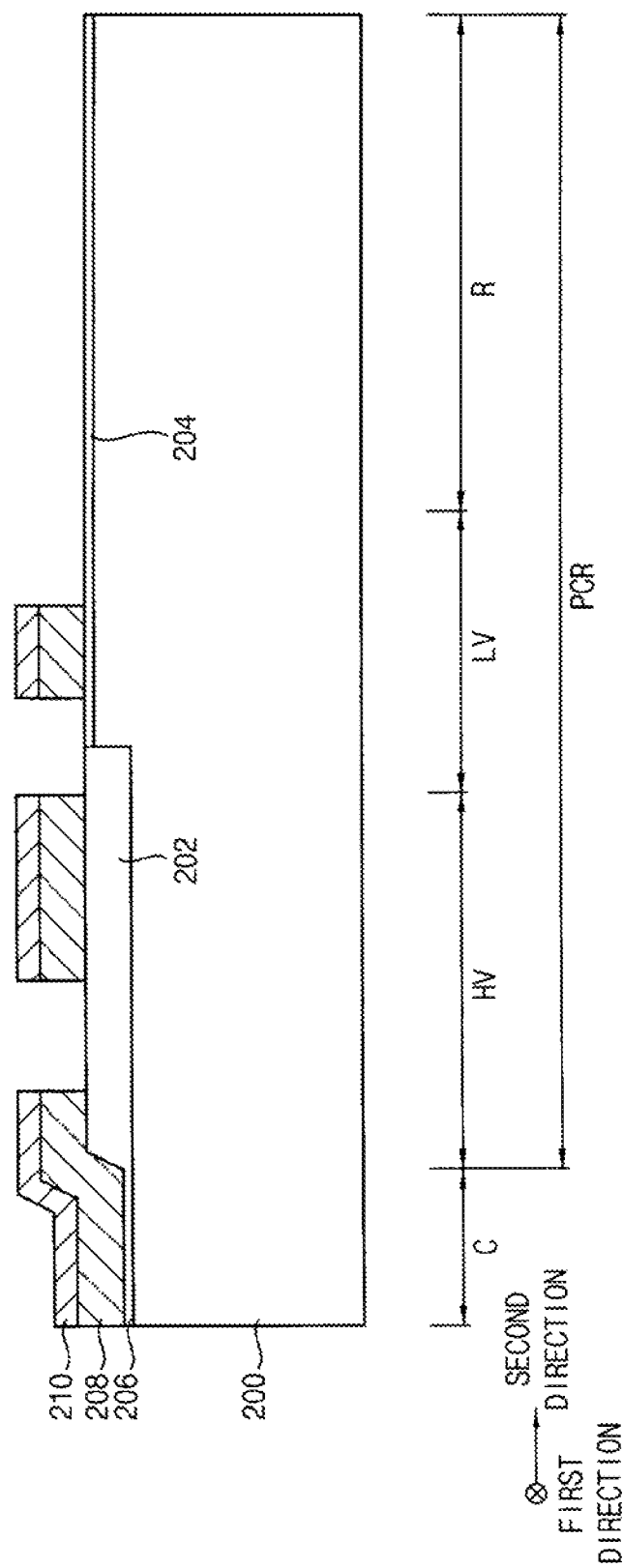

Referring to FIG. 17, a portion of the substrate 200 corresponding to the first region C and the high voltage transistor region HV may be etched such that an upper surface of the substrate 200 of the first region C and the high voltage transistor region HV may be lower than an upper surface of the substrate 200 of the lower voltage transistor LV and the resistor region R.

An insulation layer may be formed on the substrate 200 with different thicknesses in different regions (e.g., in high voltage transistor region HV and low voltage transistor region LV). For example, a first gate insulation layer 202 having a first thickness may be formed in the high voltage transistor region RV. A second gate insulation layer 204, which may be thinner than the first gate insulation layer 202, may be formed in the low voltage transistor region LV and the resistor region R. A third insulation layer 206, which may also be thinner than the first gate insulation layer 202, may be formed in the first region C.

The first gate insulation layer 202 in the high voltage transistor region HV and the second gate insulation layer 204 in the low voltage transistor region LV may each be provided as a gate insulation layer of a transistor through the following process.

A stack structure including a first polysilicon pattern 208 and a capping pattern 210 may be formed on the insulation layer (i.e., the first and second gate insulation layers 202 and 204, and the third insulation layer 206). The capping pattern 210 may include an insulation material, for example, silicon oxide, silicon nitride, and/or silicon oxynitride. The first polysilicon pattern 208 and the capping pattern 210 may be used as a mask pattern for forming an isolation trench. Thus, the first polysilicon pattern 208 and the capping pattern 210 may be formed to cover the active region. Since the resistor region R corresponds to the isolation region, the first polysilicon pattern 208 and the capping pattern 210 may not be formed in the resistor region R. In some embodiments, the first polysilicon pattern 208 may be provided as a portion of a gate of each of a high voltage transistor and a low voltage transistor.

Figure 18:
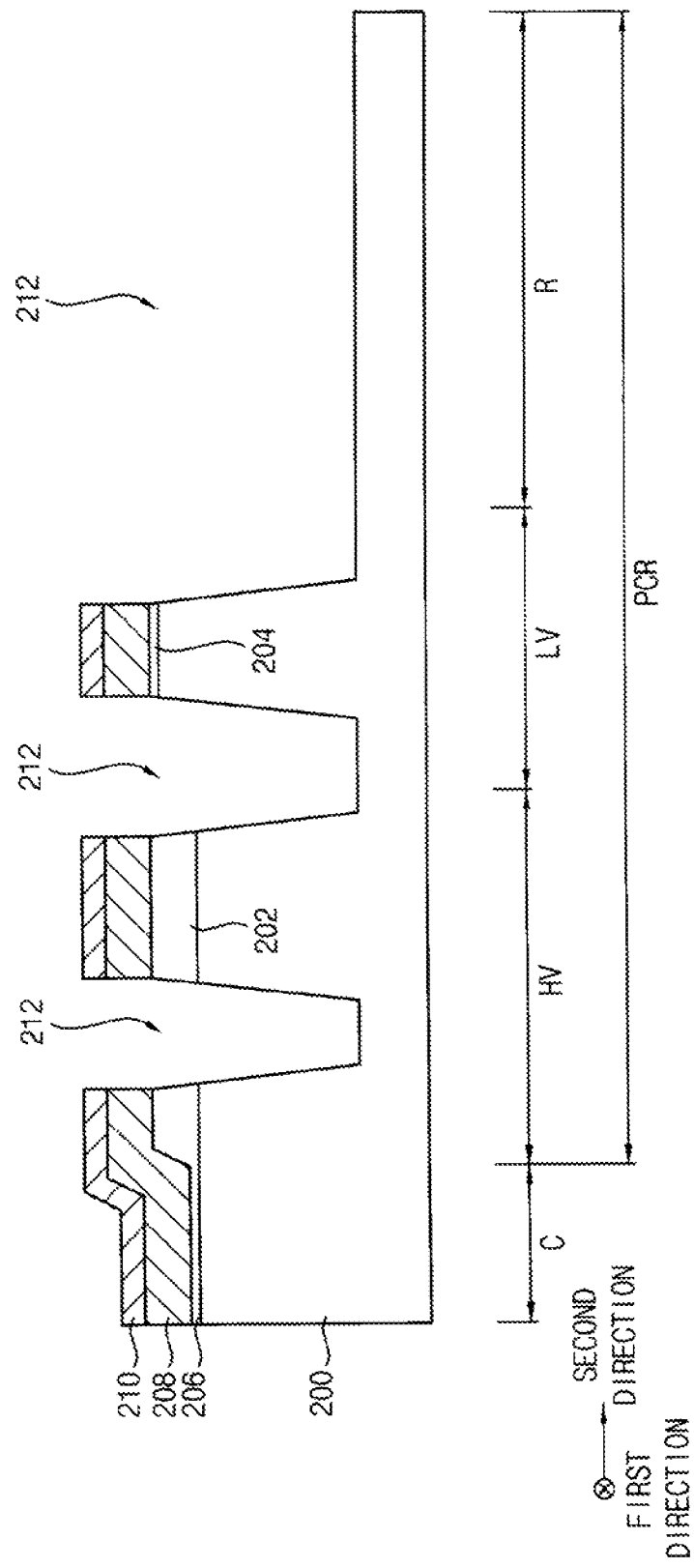

Referring to FIG. 18, the stack structure of the first polysilicon pattern 208 and the capping pattern 210 may be used as an etch mask to etch the insulation layer (i.e., the first gate insulation layer 202 and the second gate insulation layer 204) and the substrate 200, such that an isolation trench 212 may be formed. The isolation trench 212 may be formed in the resistor region R. During the etch process, the capping pattern 210 may be partly etched.

Figure 19:
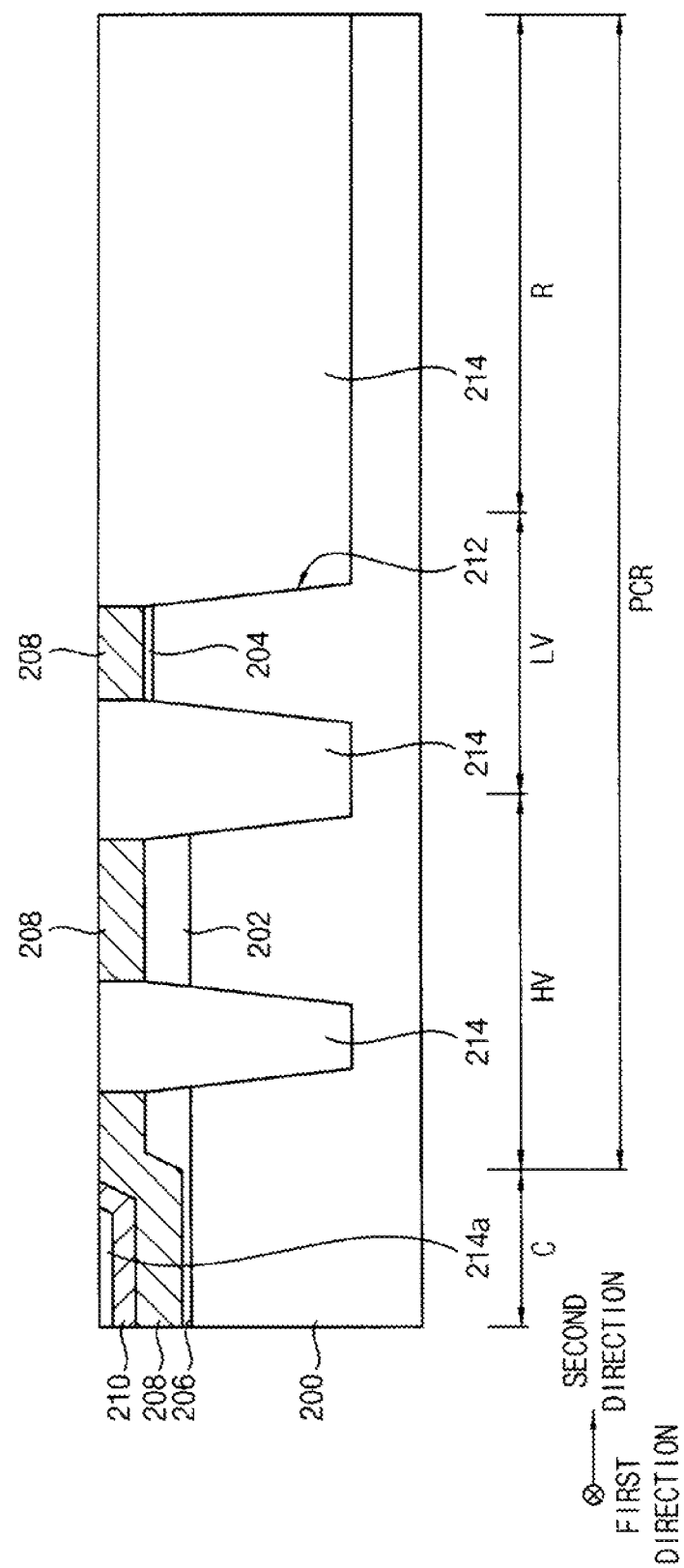

Referring to FIG. 19, an insulation layer may be formed on the capping pattern 210 to fill the isolation trench 212, and then the insulation layer may be planarized until the first polysilicon pattern 208 is exposed, such that the isolation pattern 214 may be formed in the isolation trench 212.

The planarization process may include a chemical mechanical polishing process. After the planarization process is performed, an upper surface of the isolation pattern 214 may be substantially coplanar with an upper surface of the exposed first polysilicon pattern 208.

The capping pattern 210 in the second region PCR may be removed during the planarization process. In some embodiments, as the upper surface of the substrate 200 of the first region C is relatively low, the capping pattern 210 and an insulation pattern 214a may remain on the substrate 200 of the first region C.

Figure 20:
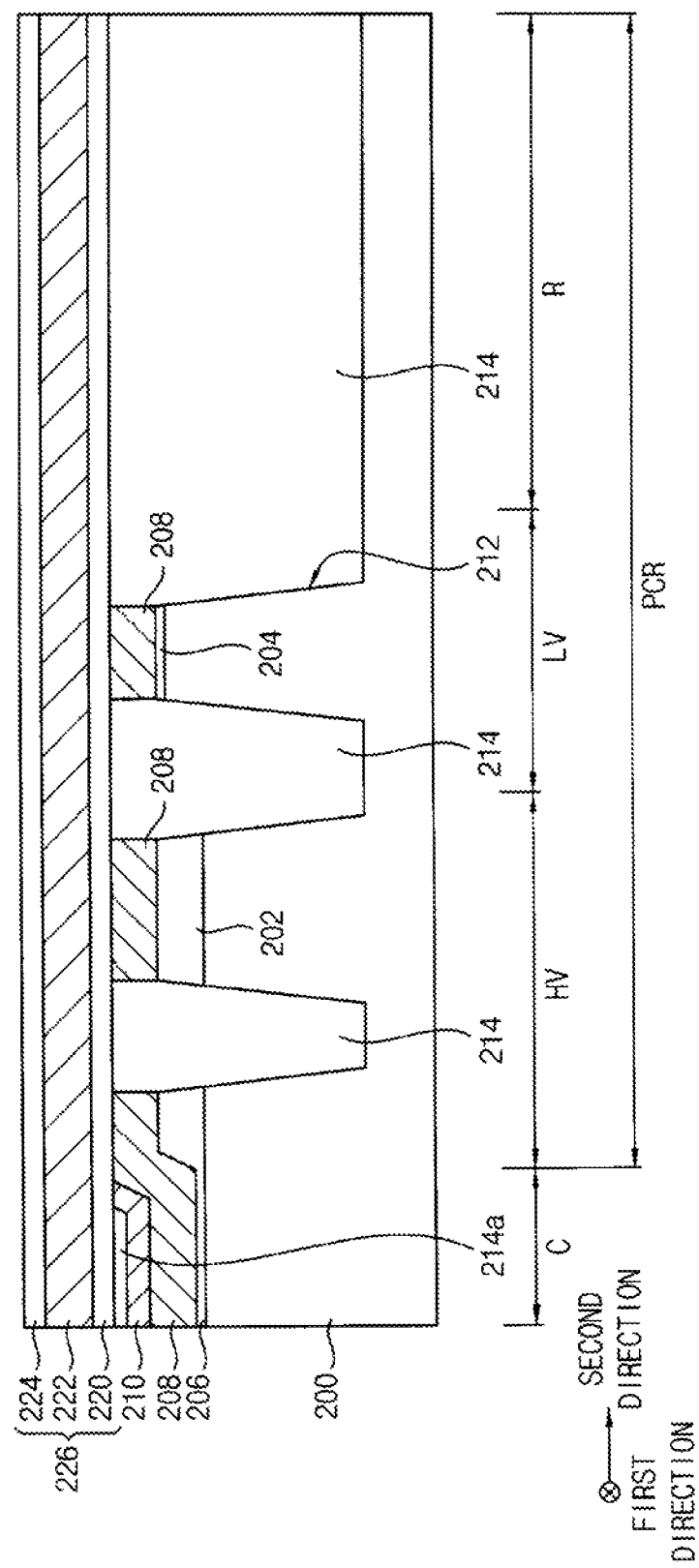

Referring to FIG. 20, a cell pattern insulation layer 226 may be formed on the isolation pattern 214, the first polysilicon pattern 208, the capping pattern 210, and the insulation pattern 214a, The cell pattern insulation layer 226 may cover an entire upper surface of the resulting structure formed in the first region C and the second region PCR.

The cell pattern insulation layer 226 may be an insulation layer to be used to form cells in the first region C. Thus, the cell pattern insulation layer 226 may be changed according to a desired structure of a call pattern. The cell pattern insulation layer 226 may include an oxide layer and/or a nitride layer.

In some embodiments, the cell pattern insulation layer 226 may have a stack structure of a lower oxide layer 220, a nitride layer 222, and an upper oxide layer 224. The lower oxide layer 220 may be provided as a pad oxide layer between the nitride layer 222 and an underlying layer. The nitride layer 222 may be used as a etch stop layer, a sacrificial layer, or a hard mask layer. The upper oxide layer 224 may be used as an interlayer insulation layer or a buffer layer for covering the nitride layer 222.

Figure 21:
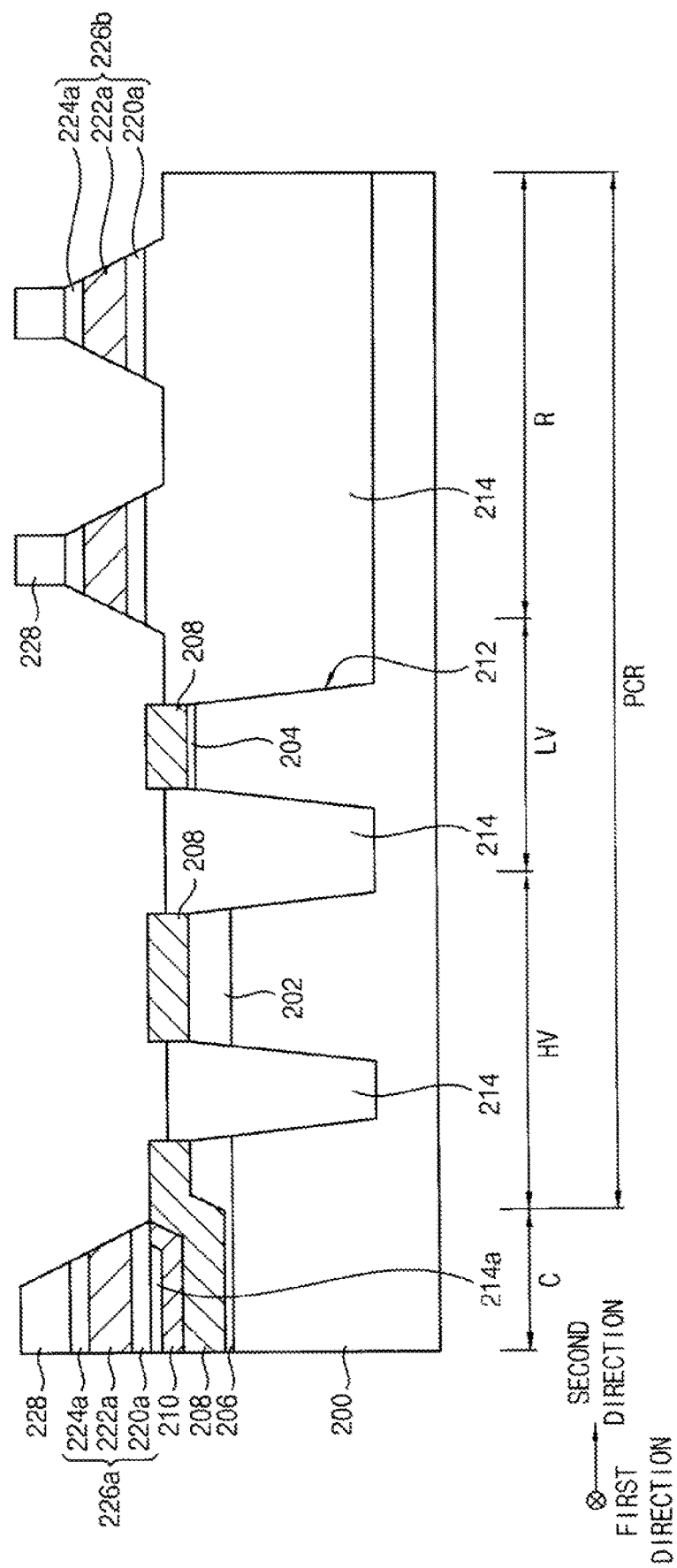

Referring to FIG. 21, a first etch mask 228 may be formed on the cell pattern insulation layer 226, and then the cell pattern insulation layer 226 may be patterned using the first etch mask 228. Thus, the cell pattern 226a may be formed in the first region C, and the lower patterns 226b may be formed in the resistor region R. The first etch mask 228 may include a photoresist pattern.

In some embodiments, to leave the cell pattern insulation layer 226 in the first region C, the first etch mask 228 may cover an entirety of the first region C. However, the cell pattern insulation layer 226 may not be formed in the second region PCR outside the resistor region R. That is, the first etch mask 228 may expose the whole second region PCR other than resistor region R. For example, since a high voltage transistor and a low voltage transistor may not include the cell pattern insulation layer 226, the first etch mask 228 may expose the high voltage transistor region HV and the low voltage transistor region LV. In addition, to form the lower patterns 226b in the resistor region R, the first etch mask 228 may have a structure of a plurality of lines extending in the first direction and spaced apart from each other in the second direction.

When the cell pattern insulation layer 226 is patterned using the first etch mask 228, the cell pattern insulation layer 226 may be completely removed in the second region PCR other than the resistor region R. Thus, the upper surfaces of the isolation pattern 214 and the first polysilicon pattern 208 may be exposed in the high voltage transistor region HV and the lower voltage transistor region LV. At that time, a portion of the upper surface of the isolation pattern 214 may be removed.

However, the lower patterns 226b extending in the first direction may be formed in the resistor region R. The lower patterns 226b may be arranged spaced apart from each other in the second direction. As such, the lower patterns 226b may be formed together with the cell pattern 226a as part of a single process (i.e., without performing a separate etch process for each pattern).

A shape of the lower patterns 226b may be the same as that described with reference to FIGS. 1 to 4. In some embodiments, the shape of the lower patterns 226b may be the same as that described with reference to FIG. 13. In some embodiments, the shape of the lower patterns 226b may be the same as that described with reference to FIG. 14.

After the etch process (which may be a single process using the first etch mask 228 to form the lower patterns 226b together with the cell pattern 226a) is performed, the first etch mask 228 may be removed.

Figure 22:
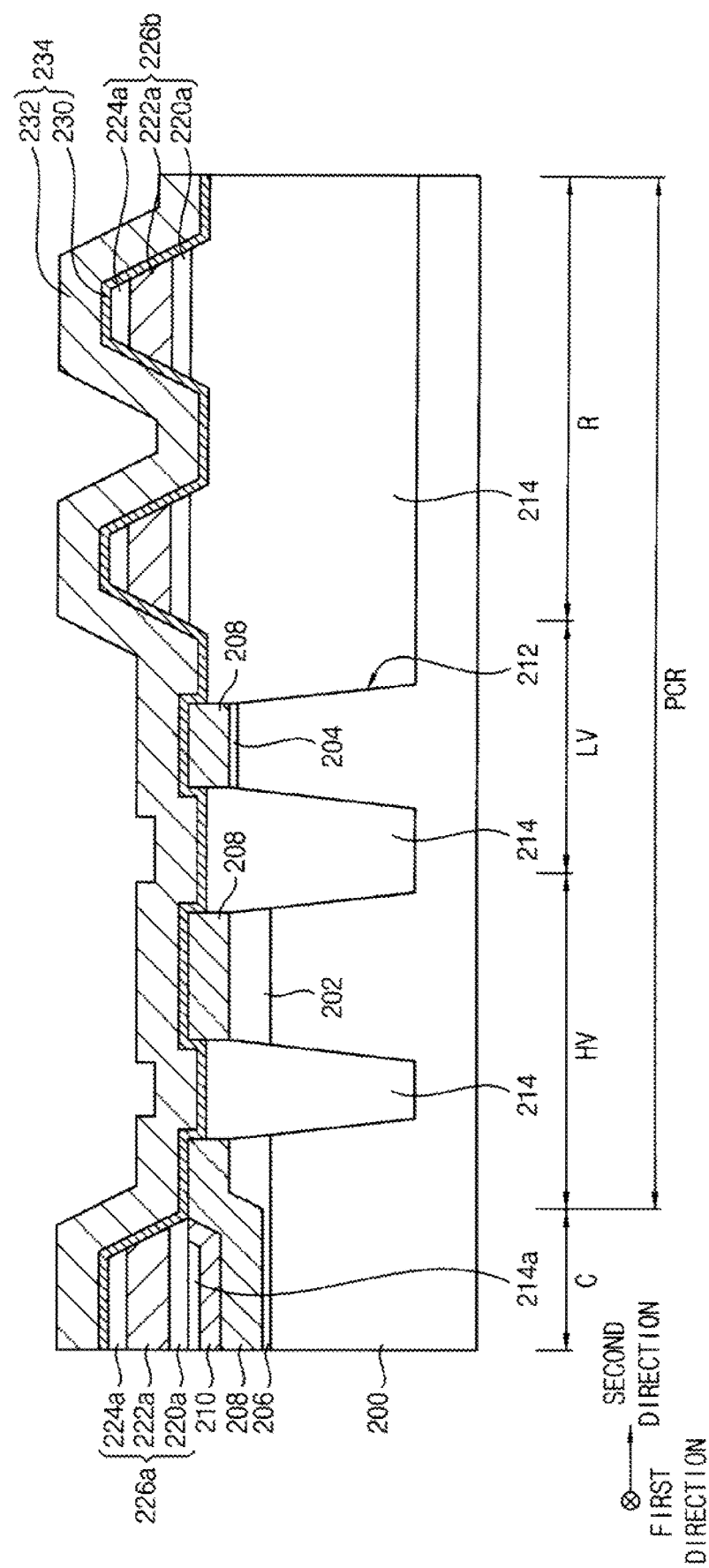

Referring to FIG. 22, a resistor layer 234 may be conformally formed on the lower patterns 226b, the isolation pattern 214, and the cell pattern 226a. The resistor layer 234 may cover a whole upper surface of the resulting structure in the first and second regions C and PCR.

A portion of the resistor layer 234 on the lower patterns 226b may have an upper surface and a lower surface protruding in the third direction, and another portion of the resistor layer 234 between the lower patterns 226b may have an upper surface and a lower surface being relatively low lower than the corresponding surfaces of the protruding portion).

In some embodiments, the resistor layer 234 may include a material for forming a desired resistor structure, for example, metal, metal silicide, metal nitride, or a semiconductor material. For example, the resistor layer 234 may be formed by stacking a polysilicon layer 230 and a tungsten silicide layer 232.

Figure 23:
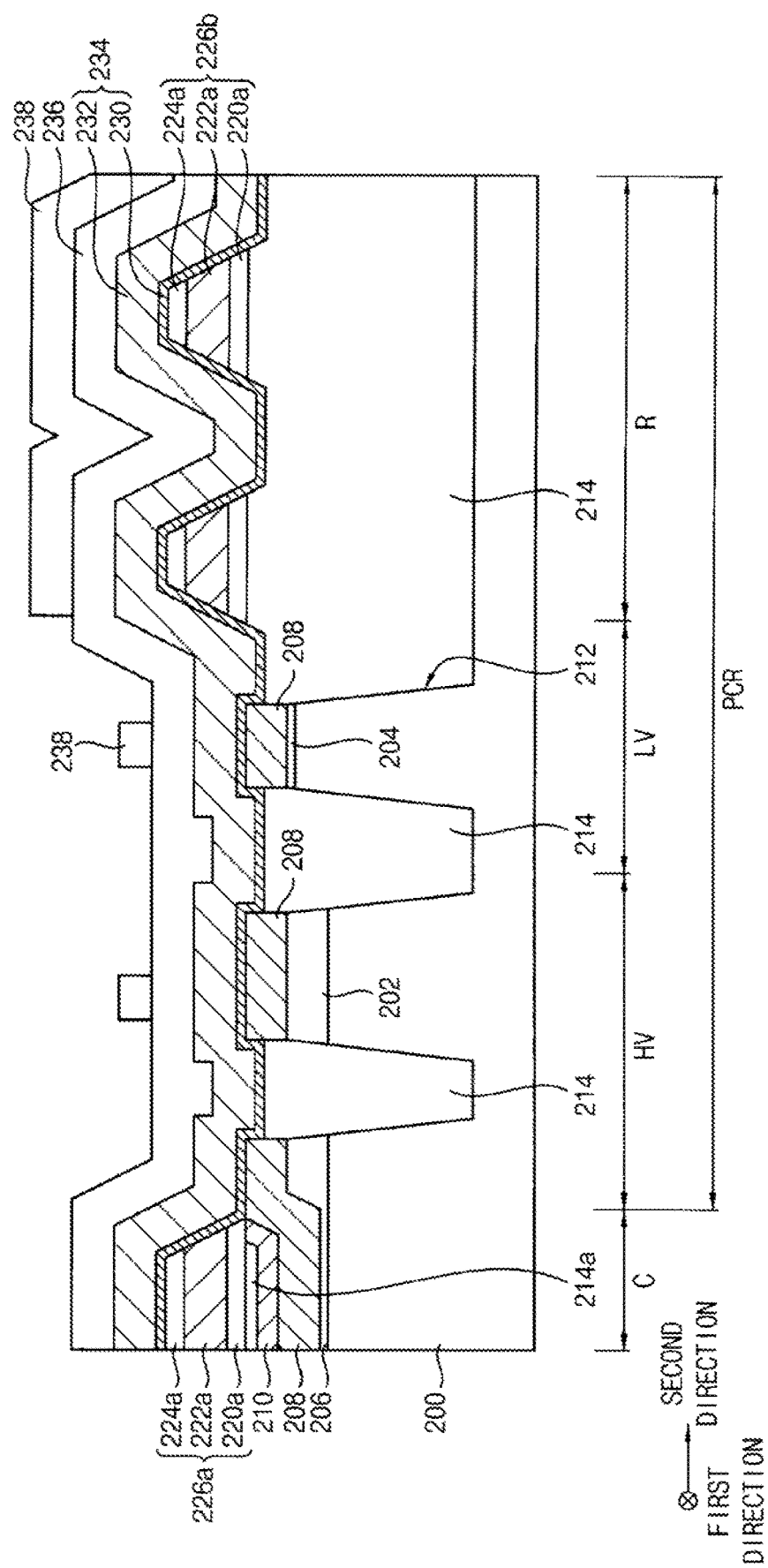

Referring to FIG. 23, a mask layer 236 may be formed to cover the resistor layer 234. A second etch mask 238 may be formed on the mask layer 236. The second etch mask 238 may be provided to form a resistor line pattern, and first and second gate structures.

In some embodiments, the mask layer 236 may include, for example, silicon oxide, silicon nitride, and/or silicon oxynitride. The second etch mask 238 may include photoresist.

The second etch mask 238 may expose the mask layer 236 in the first region C. The second etch mask 238 may cover a portion of the resulting structure in each of the high voltage transistor region HV and the low voltage transistor region LV. The second etch mask 238 in the resistor region R may have a structure of a plurality of lines that extend in the second direction and are spaced apart from each other in the first direction.

Figure 24:
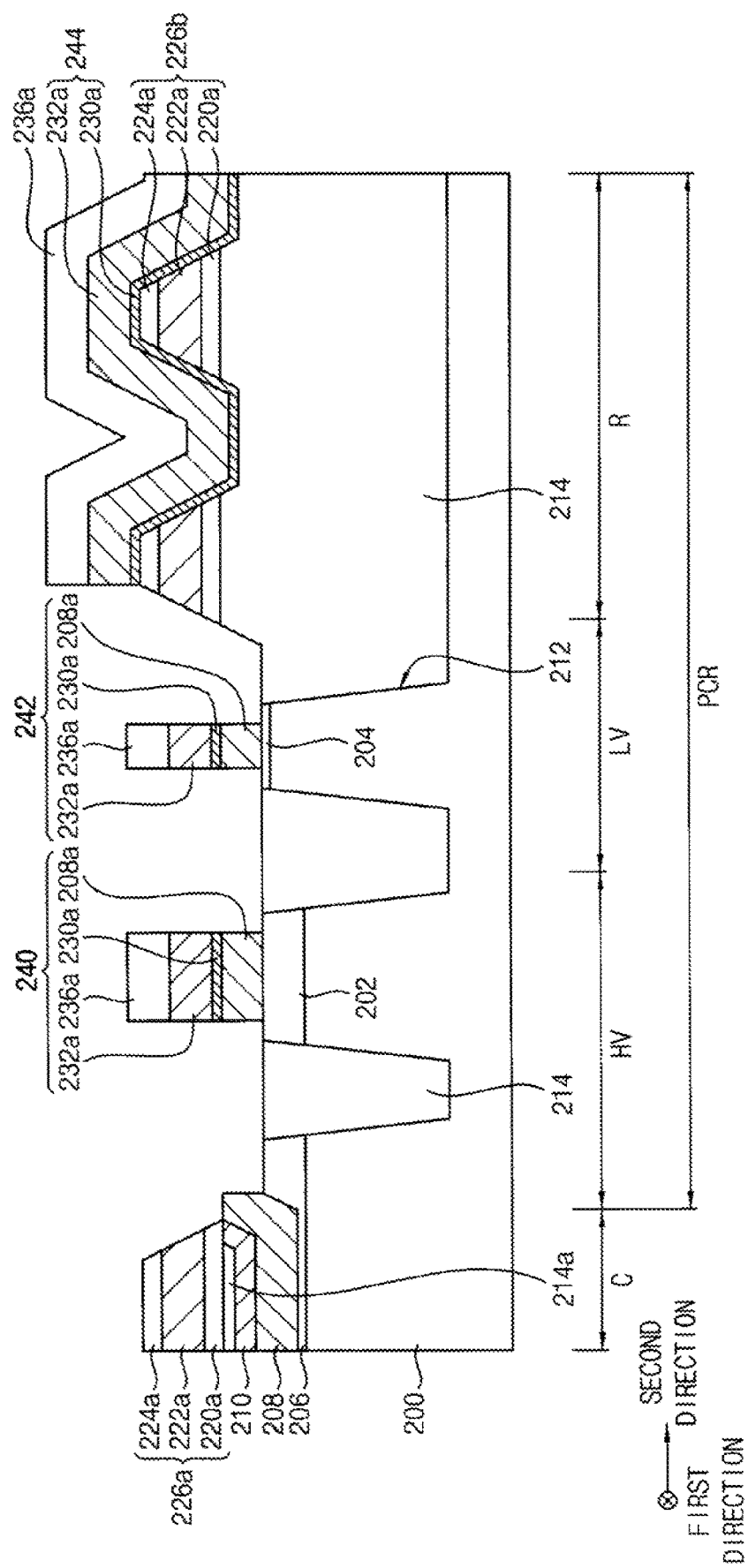

Referring to FIG. 24, the mask layer 236 may be etched using the second etch mask 238 to form a mask pattern 236a. The resistor layer 234 and the first polysilicon pattern 208 may be etched using the mask pattern 236a as an etch mask.

By the above etch process, the resistor layer 234 in the first region C may be removed, such that the cell pattern 226a may be exposed.

The first polysilicon pattern 208 and the resistor layer 234 in the high voltage transistor region HV may be patterned to form the first gate structure 240 in which the lower polysilicon pattern 208a, a resistor layer pattern, and the mask pattern 236a are stacked on the first gate insulation layer 202. For example, in the case in which the resistor layer 234 includes a polysilicon layer and a tungsten silicide layer, the first gate structure 240 may have a structure in which the lower polysilicon pattern 208a, the polysilicon pattern 230a, the tungsten silicide pattern 232a, and the mask pattern 236a are stacked.

The first polysilicon pattern 208 and the resistor layer 234 in the low voltage transistor region LV may be patterned to form the second gate structure 242 in which the lower polysilicon pattern 208a, the resistor layer pattern, and the mask pattern 236a are stacked on the second gate insulation layer 204. In some embodiments, the first and second gate structures 240 and 242 may include the same material as the resistor line pattern 244.

In the resistor region R, the resistor line pattern 244 extending in the second direction may be formed. In some embodiments, a guard ring (which may be the same as or similar to the guard ring 118 shown in FIGS. 1 and 3) may be formed on the active region contacting the resistor region R.

The resistor line pattern 244 may have the same shape as that described with reference to FIGS. 1 to 4. In some embodiments, the resistor line pattern 244 may have the same shape as that described with reference to FIG. 13. In some embodiments, the resistor line pattern 244 may have the same shape as that described with reference to FIG. 14. The mask pattern 236a may be disposed on the resistor line pattern 244.

Referring to FIG. 25, the interlayer insulation layer 250 may be formed to cover the cell pattern 226a, the first and second gate structures 240 and 242, the isolation pattern 214, the mask pattern 236a, lower patterns 226b, and the guard ring.

The interlayer insulation layer 250 may be formed by forming a silicon oxide layer by deposition of silicon oxide and then planarizing the silicon oxide layer. The planarization process may include a chemical mechanical polishing process and/or an etch back process.

A portion of the interlayer insulation layer 250 and a portion of the mask pattern 236a may be etched to form a contact hole exposing an upper surface of the resistor line pattern 244, and then a conductive material layer may be formed in the contact hole to form the contact plug 252. The contact plug 252 may include metal. For example, the contact plug 252 may include a barrier metal pattern and a metal pattern.

In some embodiments, the contact plug 252 may contact a sloped upper surface of the resistor line pattern 244 (e.g., it may contact a second portion of the resistor line pattern 244 that has the same shape as the second portion B of the merged resistor line 116a shown in FIG. 2).

In some embodiments, the contact plug 252 may contact a planar upper surface of the resistor line pattern 244 (e.g., it may contact a first portion or a third portion of the resistor line pattern 244 that has the same shape as the first portion A or the third portion C of the merged resistor line 116a shown in FIG. 2).

In some embodiments, the lower patterns 226b may not be formed in the contact region P. In this case, the resistor line pattern 244 in the contact region P may have a flat upper surface, and the contact plug 252 may be formed on the flat upper surface of the resistor line pattern 244.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A semiconductor device comprising:
   a substrate comprising a cell region, a transistor region, and a resistor region;
   a plurality of lower patterns in the resistor region, wherein the plurality of lower patterns extend in a first direction parallel to a surface of the substrate and are spaced apart from each other in a second direction perpendicular to the first direction and parallel to the surface of the substrate, and wherein each of the plurality of lower patterns comprises a plurality of materials arranged in a stack structure;
   a resistor line pattern on the plurality of lower patterns and the substrate of the resistor region, wherein the resistor line pattern extends in the second direction, and the resistor line pattern on the lower patterns has an upper surface and a lower surface protruding in a third direction perpendicular to the surface of the substrate, wherein an entire lower surface of the resistor line pattern contacts an insulation material;
   a cell pattern in the cell region, wherein the cell pattern is located at a same layer as the plurality of lower patterns and includes a same material and a same stack structure as each of the plurality of lower patterns; and
   a gate structure in the transistor region.

2. The semiconductor device of claim 1, wherein the gate structure includes a material included in the resistor line pattern.

3. The semiconductor device of claim 1, further comprising:
an interlayer insulation layer; and
a contact plug penetrating the interlayer insulation layer to contact the upper surface of the resistor line pattern.

4. The semiconductor device of claim 3, wherein the resistor line pattern on a sidewall of each of the plurality of lower patterns has the upper surface that is sloped, and
wherein the contact plug contacts the sloped upper surface of the resistor line pattern.

5. A semiconductor device comprising:
a substrate comprising a resistor region;
a plurality of lower patterns in the resistor region, wherein the plurality of lower patterns extend in a first direction parallel to a surface of the substrate and are spaced apart from each other in a second direction perpendicular to the first direction and parallel to the surface of the substrate; and
a resistor line pattern on the plurality of lower patterns and the substrate of the resistor region, wherein the resistor line pattern extends in the second direction, and the resistor line pattern on the lower patterns has a raised portion in a third direction perpendicular to the surface of the substrate to form a wave shape,
wherein an entire lower surface of the resistor line pattern contacts an insulation material, and wherein each of the lower patterns comprises a plurality of materials arranged in a stack structure.

6. The semiconductor device of claim 1, wherein the substrate further comprises a cell region, and
wherein the semiconductor device further comprises a cell pattern being in the cell region and having a same stack structure and a same material as each of the plurality of lower patterns.

7. The semiconductor device of claim 1, wherein the resistor region comprises an isolation pattern in the substrate or an interlayer insulation layer on the substrate.

8. The semiconductor device of claim 1, wherein the plurality of lower patterns have a same shape or different shapes depending on a location in the resistor region.

9. The semiconductor device of claim 1, wherein each of the plurality of lower patterns has a flat upper surface and a sidewall sloped in the second direction.

10. The semiconductor device of claim 1, wherein the plurality of lower patterns includes the insulation material.

11. The semiconductor device of claim 1, wherein the plurality of lower patterns are disposed in a portion of the resistor region.

12. The semiconductor device of claim 1, wherein the resistor line pattern comprises a plurality of resistor line patterns, and
wherein the plurality of resistor line patterns are spaced apart from each other in the first direction.

13. The semiconductor device of claim 12, wherein end portions of adjacent ones of the plurality of resistor line patterns are merged into a merged portion having an increasing width in the first direction.

14. The semiconductor device of claim 1, wherein the resistor line pattern comprises a first portion having an upper surface and a lower surface that are high with respect to the surface of the substrate, a third portion having an upper surface and a lower surface that are low with respect to the surface of the substrate, and a second portion connecting the first portion and the third portion and having an upper surface and a lower surface that are sloped.

15. The semiconductor device of claim 14, further comprising:
an interlayer insulation layer on the resistor line pattern.

16. The semiconductor device of claim 15, further comprising
a contact plug penetrating the interlayer insulation layer to contact the resistor line pattern.

17. A semiconductor device comprising:
a substrate comprising a cell region and a resistor region;
a plurality of lower patterns in the resistor region, wherein the plurality of lower patterns extend in a first direction parallel to a surface of the substrate and are spaced apart from each other in a second direction perpendicular to the first direction and parallel to the surface of the substrate, and wherein each of the plurality of lower patterns comprises a plurality of materials arranged in a stack structure;
a resistor line pattern on the plurality of lower patterns and the substrate of the resistor region, wherein the resistor line pattern extends in the second direction, and the resistor line pattern on the lower patterns has an upper surface and a lower surface protruding in a third direction perpendicular to the surface of the substrate, wherein an entire lower surface of the resistor line pattern contacts an insulation material; and
a cell pattern in the cell region, wherein the cell pattern includes at least one same material and the same stack structure as each of the plurality of lower patterns.

18. The semiconductor device of claim 17, wherein each of the plurality of lower patterns has a flat upper surface and a sidewall sloped in the second direction and includes an insulating material.

19. The semiconductor device of claim 17, further comprising:
an interlayer insulation layer on the resistor line pattern; and
a contact plug penetrating the interlayer insulation layer to contact the upper surface of the resistor line pattern.

20. The semiconductor device of claim 19, wherein the resistor line pattern on a sidewall of each of the plurality of lower patterns has the upper surface that is sloped, and
wherein the contact plug contacts the sloped upper surface of the resistor line pattern.

* * * * *